(12) United States Patent
Jun et al.

(10) Patent No.: US 11,798,850 B2
(45) Date of Patent: Oct. 24, 2023

(54) SEMICONDUCTOR DEVICE INCLUDING CONTACT STRUCTURE

(71) Applicant: SAMSUNG ELECTRONICS CO., LTD., Suwon-si (KR)

(72) Inventors: Hwi Chan Jun, Yongin-si (KR); Chang Hwa Kim, Hwaseong-si (KR); Dae Won Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 297 days.

(21) Appl. No.: 17/398,623

(22) Filed: Aug. 10, 2021

(65) Prior Publication Data

US 2021/0375692 A1    Dec. 2, 2021

Related U.S. Application Data

(60) Continuation of application No. 16/169,326, filed on Oct. 24, 2018, now Pat. No. 11,094,593, which is a
(Continued)

(30) Foreign Application Priority Data

Aug. 11, 2016    (KR) .................. 10-2016-0102474

(51) Int. Cl.
*H01L 27/088*    (2006.01)
*H01L 21/8234*   (2006.01)
(Continued)

(52) U.S. Cl.
CPC ............... *H01L 21/823475* (2013.01); *H01L 21/823418* (2013.01); *H01L 21/823431* (2013.01);
(Continued)

(58) Field of Classification Search
CPC ......... H01L 21/823475; H01L 23/5226; H01L 21/823418; H01L 27/0886; H01L 21/823431; H01L 21/823481
See application file for complete search history.

(56) References Cited

U.S. PATENT DOCUMENTS 8,303,710 B2    11/2012    D'Evelyn
8,765,546 B1    7/2014     Hung et al.
(Continued)

FOREIGN PATENT DOCUMENTS

CN    103137624    6/2013
CN    104425493    3/2015
(Continued)

OTHER PUBLICATIONS

Notice of Allowance dated Apr. 5, 2023 in corresponding Korean Patent Application 10-2016-0102474 (2 pages) (In Korean).
(Continued)

*Primary Examiner* — Ismail A Muse
(74) *Attorney, Agent, or Firm* — F. CHAU & ASSOCIATES, LLC

(57) ABSTRACT

A semiconductor device including a contact structure is provided. The semiconductor device includes an isolation region defining a lower active region. First and second source/drain regions and first and second gate electrodes are on the lower active region. The first and second source/drain regions are adjacent to each other. First and second gate capping patterns are on the first and second gate electrodes, respectively. First and second contact structures are on the first and second source/drain regions, respectively. A lower insulating pattern is between the first and second source/drain regions. An upper insulating pattern is between the first and second contact structures. Silicon oxide has etching selectivity with respect to an insulating material which the
(Continued)

upper insulating pattern, the first gate capping pattern, and the second gate capping pattern are formed of.

17 Claims, 52 Drawing Sheets

Related U.S. Application Data division of application No. 15/449,302, filed on Mar. 3, 2017, now Pat. No. 10,153,212.

(51) Int. Cl.
| | |
|---|---|
| H01L 29/66 | (2006.01) |
| H01L 29/78 | (2006.01) |
| H01L 23/522 | (2006.01) |
| H01L 21/8238 | (2006.01) |

(52) U.S. Cl.
CPC .. *H01L 21/823481* (2013.01); *H01L 23/5226* (2013.01); *H01L 27/0886* (2013.01); *H01L 29/66545* (2013.01); *H01L 29/66795* (2013.01); *H01L 29/785* (2013.01); *H01L 21/823814* (2013.01); *H01L 21/823878* (2013.01)

(56) References Cited

U.S. PATENT DOCUMENTS

| 8,878,309 | B1 | 11/2014 | Hong et al. |
| 8,969,163 | B2 * | 3/2015 | Aquilino ........... H01L 21/76232 |
| | | | 257/E21.414 |
| 9,147,747 | B2 | 9/2015 | Hung et al. |
| 9,230,816 | B1 | 1/2016 | Hung et al. |
| 9,299,700 | B2 | 3/2016 | Park et al. |
| 10,153,212 | B2 | 12/2018 | Jun et al. |
| 2008/0237733 | A1 | 10/2008 | Chen et al. |
| 2009/0108378 | A1 | 4/2009 | Zhu et al. |
| 2011/0089497 | A1 | 4/2011 | Fukutome |
| 2011/0171805 | A1 | 7/2011 | Yu et al. |
| 2011/0223736 | A1 | 9/2011 | Lin et al. |
| 2012/0223394 | A1 | 9/2012 | Toh et al. |
| 2013/0140639 | A1 | 6/2013 | Shieh et al. |
| 2013/0175629 | A1 | 7/2013 | Chang |
| 2014/0117454 | A1 | 5/2014 | Liu et al. |
| 2014/0197499 | A1 | 7/2014 | Chen et al. |
| 2014/0199827 | A1 | 7/2014 | Chang |
| 2015/0021710 | A1 | 1/2015 | Hsu et al. |
| 2015/0140747 | A1 | 5/2015 | Kim et al. |
| 2015/0214341 | A1 * | 7/2015 | Shin ................ H01L 21/76202 |
| | | | 438/425 |
| 2015/0221654 | A1 * | 8/2015 | Kim .................... H01L 21/0262 |
| | | | 257/77 |
| 2016/0013096 | A1 | 1/2016 | Doris et al. |
| 2016/0020210 | A1 | 1/2016 | Liaw |
| 2016/0043170 | A1 | 2/2016 | Park et al. |
| 2016/0104646 | A1 | 4/2016 | Hung et al. |
| 2016/0111524 | A1 | 4/2016 | Ha et al. |
| 2016/0163832 | A1 | 6/2016 | Yin et al. |
| 2016/0307890 | A1 | 10/2016 | Yeo et al. |
| 2017/0110456 | A1 * | 4/2017 | Jeon ................ H01L 21/823878 |
| 2017/0154823 | A1 | 6/2017 | Tseng et al. |
| 2017/0317213 | A1 | 11/2017 | Park et al. |
| 2018/0040694 | A1 | 2/2018 | Tseng et al. |
| 2018/0047634 | A1 | 2/2018 | Jun et al. |
| 2018/0053832 | A1 | 2/2018 | Beyer et al. |
| 2019/0057907 | A1 | 2/2019 | Jun et al. |

FOREIGN PATENT DOCUMENTS

| WO | 2014130129 | 8/2014 |
| WO | 2015054913 | 4/2015 |
| WO | 2015054928 | 4/2015 |

OTHER PUBLICATIONS

Taiwan Office Action dated Mar. 5, 2021 in corresponding Taiwan Application No. 106115405 (in Taiwanese), 14 pages.
Office Action dated Oct. 27, 2021 in corresponding Chinese Patent Application No. 201710325741.0, in Chinese, 14 pages.

* cited by examiner

SEMICONDUCTOR DEVICE INCLUDING CONTACT STRUCTURE

CROSS-REFERENCE TO RELATED APPLICATION

This application is a continuation of U.S. application Ser. No. 16/169,326, filed on Oct. 24, 2018, which is a divisional application of U.S. patent application Ser. No. 15/449,302, filed on Mar. 3, 2017, now U.S. Pat. No. 10,153,212, issued Dec. 11, 2018, which claims priority under 35 U.S.C. § 119 to Korean Patent Application No. 10-2016-0102474 filed on Aug. 11, 2016 in the Korean Intellectual Property Office, the disclosures of which are incorporated by reference herein in their entirety.

TECHNICAL FIELD

The present inventive concept relates to a semiconductor device including a contact structure and a method of forming the same.

DISCUSSION OF RELATED ART

Recently, to achieve high degrees of integration in semiconductor devices, the line width of gates and the distance between gates have been greatly reduced. With the reduced dimensions, as contact structures are formed between gates, various problems, such as small process window for the photolithography process, electrical shorts generated in conductive patterns disposed adjacent to each other, and the like, may occur.

SUMMARY

The present inventive concept may provide a semiconductor device including a contact structure having enhanced reliability, and a method of forming the semiconductor device.

According to an aspect of the present inventive concept, a semiconductor device may be provided. The semiconductor device includes a first isolation region defining a lower active region. A first fin active region and a second fin active region are disposed on the lower active region. A first gate structure overlapping the first fin active region and a second gate structure overlapping the second fin active region may be disposed. Each of the first gate structure and the second gate structure includes gate spacers, as well as a gate electrode and a gate capping pattern, disposed between the gate spacers and stacked in sequence. A first source/drain region is disposed in the first recess of the first fin active region. A second source/drain region is disposed in the second recess of the second fin active region. A first contact structure is disposed on the first source/drain region. A second contact structure is disposed on the second source/drain region. An interlayer insulating pattern is disposed on the first isolation region. A lower insulating pattern is disposed between the first fin active region and the second fin active region. A first upper insulating pattern overlapping the lower insulating pattern may be disposed. The first upper insulating pattern is disposed between the first contact structure and the second contact structure. A second upper insulating pattern is disposed on the interlayer insulating pattern. The interlayer insulating pattern may have etching selectivity with respect to the first upper insulating pattern, the second upper insulating pattern, and the gate capping pattern.

According to an aspect of the present inventive concept, a semiconductor device may be provided. The semiconductor device includes a first fin active region and a second fin active region, disposed on a first device region of a semiconductor substrate and opposing each other. A groove portion is disposed between the first fin active region and the second fin active region. A first gate structure is disposed on the first fin active region, while a second gate structure may be disposed on the second fin active region. Each of the first gate structure and the second gate structure includes gate spacers, as well as a gate electrode and a gate capping pattern, disposed between the gate spacers and stacked in sequence. An insulating structure is disposed between the first gate structure and the second gate structure. The insulating structure extends into the groove portion. The insulating structure includes a lower insulating pattern in the groove portion and an upper insulating pattern on the lower insulating pattern. A first contact structure is disposed between the insulating structure and the first gate structure, while a second contact structure is disposed between the insulating structure and the second gate structure. Upper surfaces of the first contact structure, the second contact structure, the upper insulating pattern, and the gate capping pattern are coplanar with each other.

An aspect of the present inventive concept may provide a semiconductor device. The semiconductor device includes an isolation region defining a lower active region. A first FinFET and a second FinFET are disposed on the lower active region. The first FinFET includes a first source/drain region and a first gate electrode. The second FinFET includes a second source/drain region and a second gate electrode. The first and second source/drain regions are disposed to be adjacent to each other. First and second gate capping patterns are disposed on the first and second gate electrodes, respectively. First and second contact structures are disposed on the first and second source/drain regions, respectively. A lower insulating pattern is disposed on the lower active region. The lower insulating pattern is disposed between the first and second source/drain regions. An upper insulating pattern is disposed on the lower insulating pattern. The upper insulating pattern is disposed between the first and second contact structures. Silicon oxide may have etching selectivity with respect to an insulating material which the upper insulating pattern, the first gate capping pattern, and the second gate capping pattern are formed of.

An aspect of the present inventive concept may provide a semiconductor device. The semiconductor device may include a lower active region defined by an isolation region. A first fin active region and a second fin active region, having opposing ends, are disposed on the lower active region. A first gate structure is disposed on the first fin active region. A second gate structure is disposed on the second fin active region. Each of the first gate structure and the second gate structure includes gate spacers, as well as a gate electrode and a gate capping pattern, disposed between the gate spacers and stacked in sequence. An interlayer insulating pattern is disposed on the isolation region. An insulating structure is disposed between the first fin active region and the second fin active region. The insulating structure is disposed between the first gate structure and the second gate structure. A first contact structure is disposed between the insulating structure and the first gate structure. A second contact structure is disposed between the insulating structure and the second gate structure. The insulating structure includes a lower insulating pattern disposed between the first fin active region and the second fin active region, and includes an upper insulating pattern disposed on the lower insulating pattern and having a width different from that of the lower insulating pattern. The interlayer insulating pattern has etching selectivity with respect to an insulating material which the gate capping pattern and the upper insulating pattern may be formed of.

According to an aspect of the present inventive concept, a method of forming a semiconductor device may be provided.

A semiconductor substrate is provided. An isolation region defining a lower active region may be formed on the semiconductor substrate. A first fin active region and a second fin active region may be formed on the lower active region. Sacrificial gate structures may be formed on the first fin active region and the second fin active region. An interlayer insulating pattern may be formed on the isolation region and between the sacrificial gate structures. A groove portion may be formed between the first fin active region and the second fin active region. A first gate structure may be formed on the first fin active region and a second gate structure may be formed on the second fin active region by replacing the sacrificial gate structures. Each of the first gate structure and the second gate structure may include gate spacers, as well as a gate electrode and a gate capping pattern, which are disposed between the gate spacers and stacked in sequence. An insulating structure may be formed between the first and second gate structures on the groove portion and extending into the groove portion. The insulating structure may include a lower insulating pattern in the groove portion and an upper insulating pattern on the lower insulating pattern. A first contact structure and a second contact structure may be formed by etching the interlayer insulating pattern using the upper insulating pattern and the gate capping pattern as an etching mask to form contact openings, followed by filling the contact openings to form the first contact structure between the insulating structure and the first gate structure, and the second contact structure between the insulating structure and the second gate structure.

BRIEF DESCRIPTION OF THE DRAWINGS

The above and other aspects and features of the present inventive concept will be more clearly understood from the following detailed description taken in conjunction with the accompanying drawings, in which.

Figure 1:
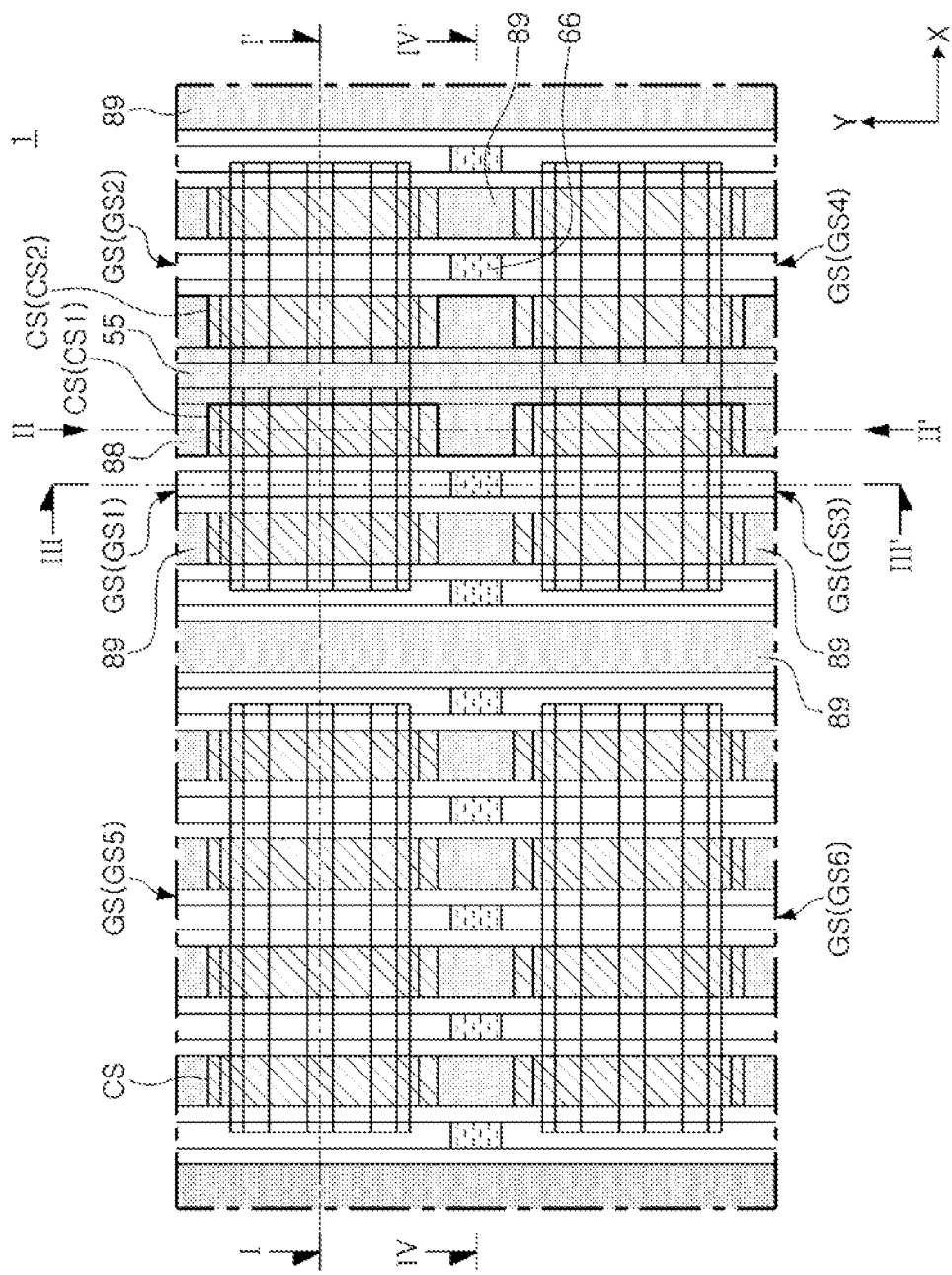
FIGS. 1, 2A-2C, 3A-3D and 4 are views of an example of a semiconductor device according to an example embodiment of the present inventive concept.

Since the drawings in FIGS. 1-29 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Figure 2A:
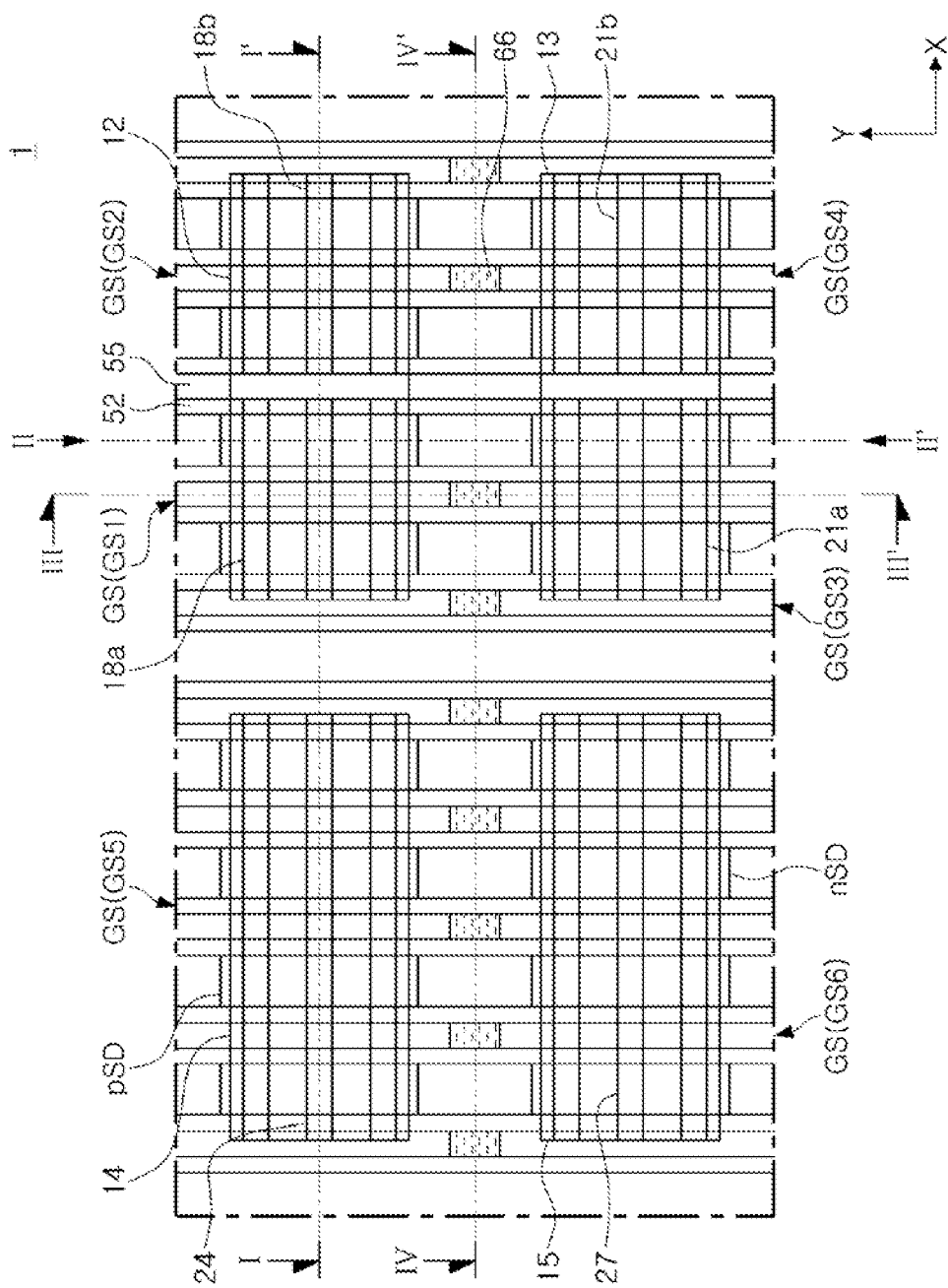
Figure 2B:
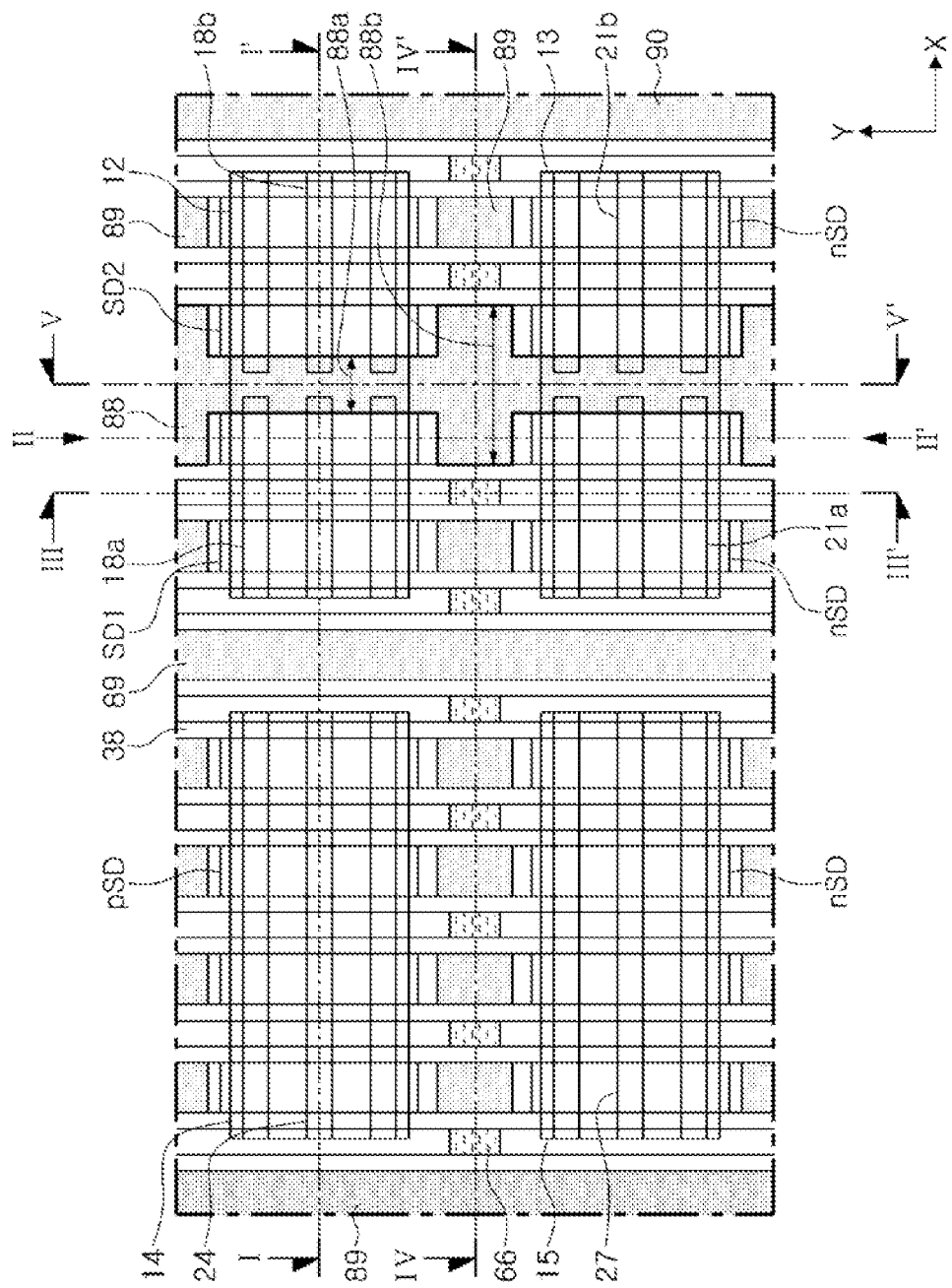
Figure 2C:
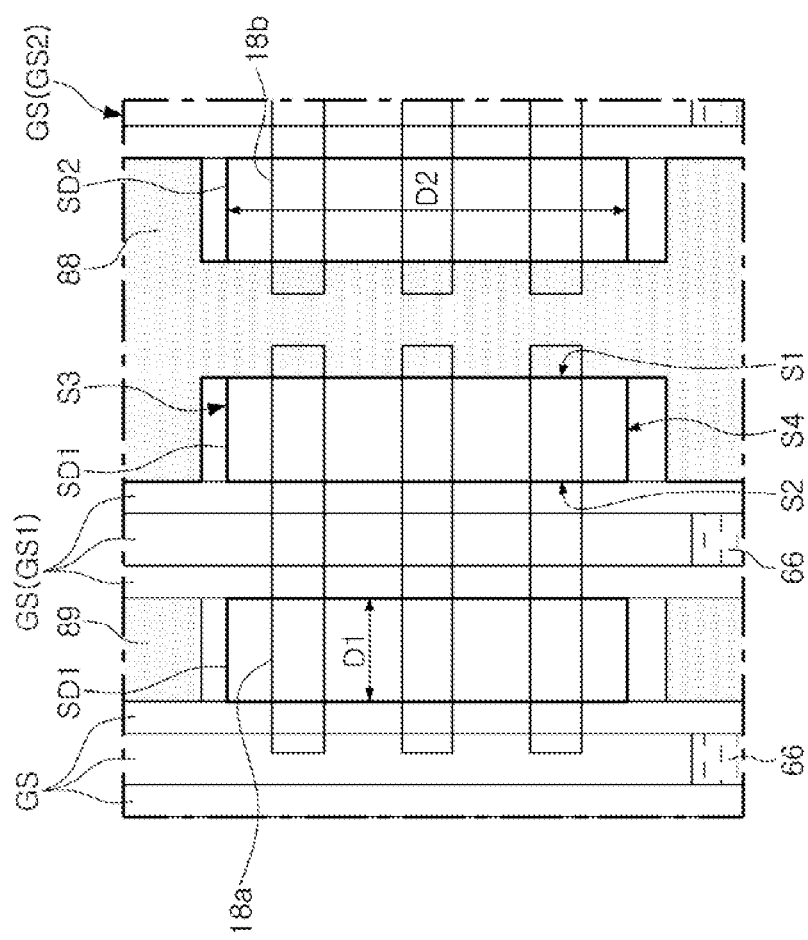
Figure 3A:
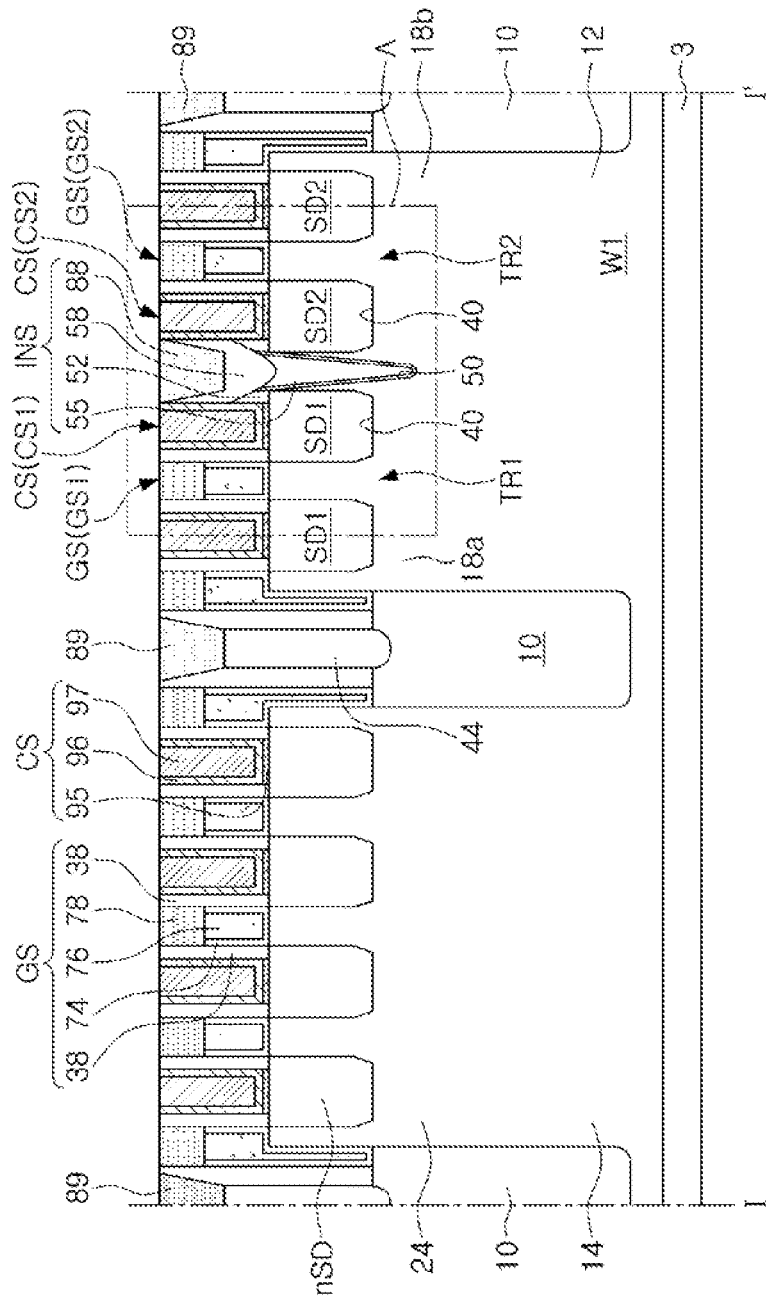
Figure 3B:
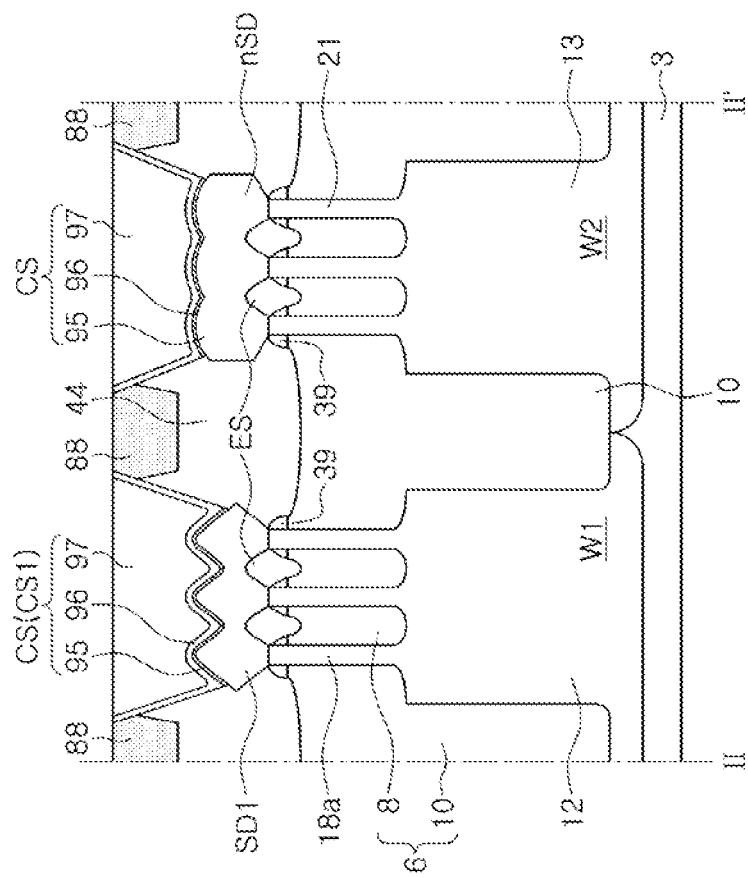
Figure 3C:
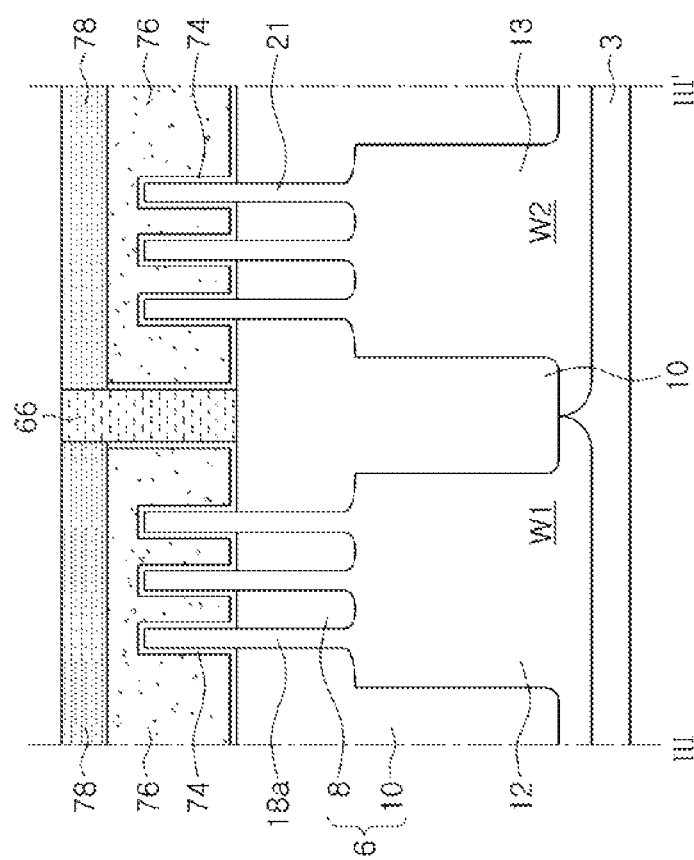
Figure 3D:
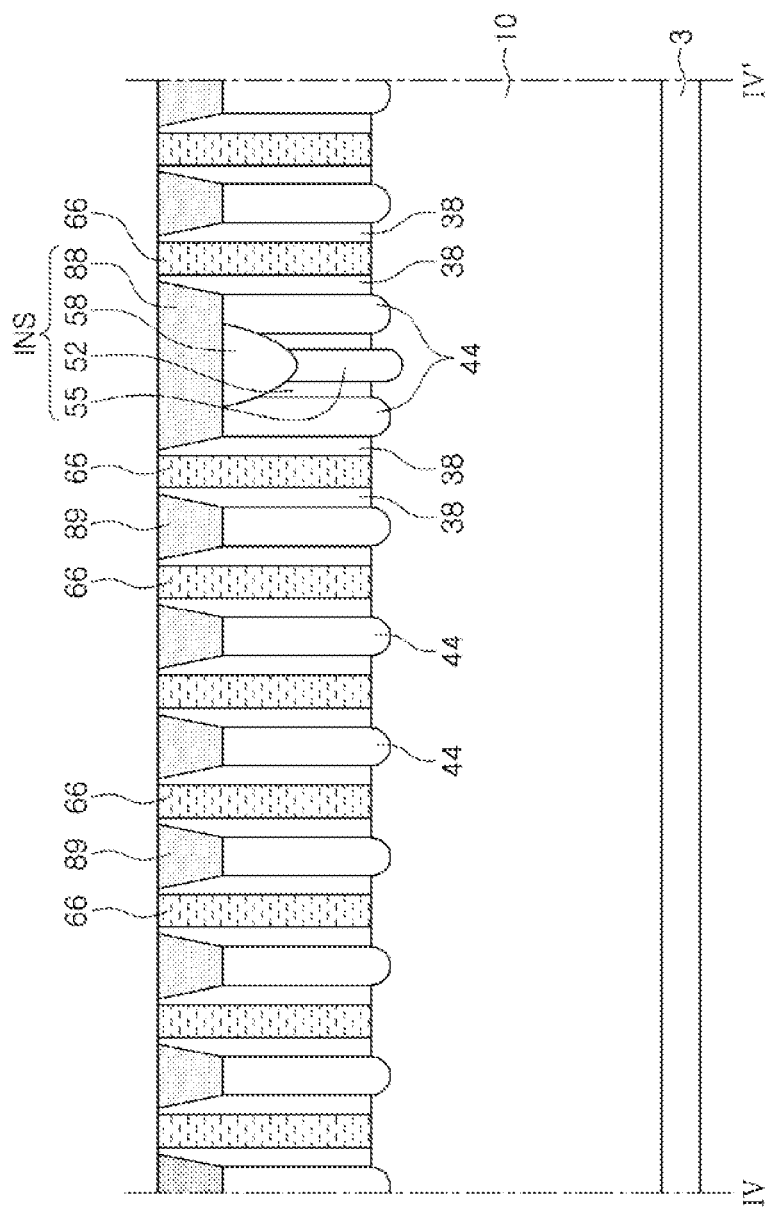
Figure 4:
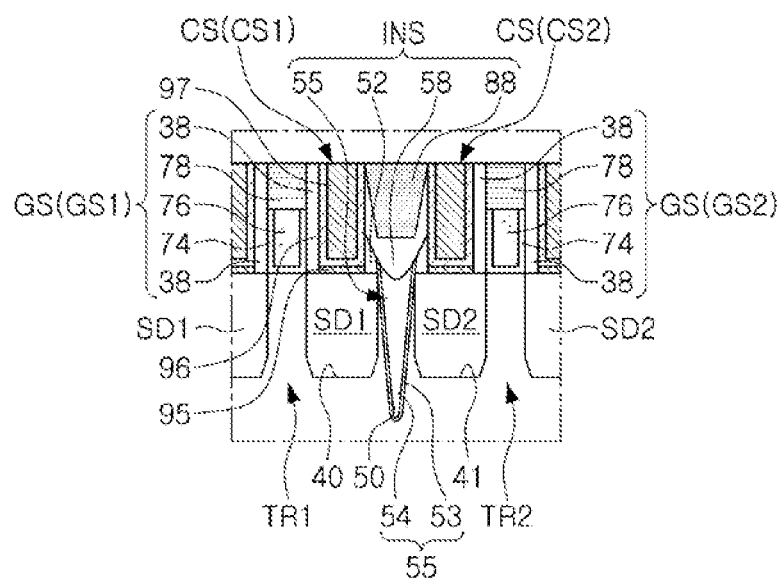

FIGS. 1, 2A-2C, 3A-3D and 4 are views of an example of a semiconductor device according to an example embodiment of the present inventive concept. In FIGS. 1, 2A-2C, 3A-3D and 4, FIG. 1 is a top view of an example of a semiconductor device according to an example embodiment of the present inventive concept; FIGS. 2A and 2B are top views of a component of FIG. 1; and FIG. 2C is a partially enlarged top view of a component of FIG. 1. FIG. 3A is a cross-sectional view taken along line I-I' of FIGS. 1, 2A, and 2B; FIG. 3B is a cross-sectional view taken along line II-II' of FIGS. 1, 2A, and 2B; FIG. 3C is a cross-sectional view taken along line of FIGS. 1, 2A, and 2B; and FIG. 3D is a cross-sectional view taken along line IV-IV' of FIGS. 1, 2A, and 2B. FIG. 4 is an enlarged view of the region marked "A" in FIG. 3A.

An example of a semiconductor device according to an example embodiment of the present inventive concept will be described with reference to FIGS. 1, 2A-2C, 3A-3D and 4.

With reference to FIGS. 1, 2A-2C, 3A-3D and 4, a semiconductor device 1, according to an example embodiment of the present inventive concept, may include active regions and an isolation region 6, disposed on a semiconductor substrate 3. The isolation region 6 may define the active regions and may divide fin active regions or fin active lines which penetrate through and protrude above the isolation region 6 in each active region. The isolation region 6 may include silicon oxide or a silicon oxide-based insulating material.

The active regions may include a first lower active region 12, a second lower active region 13, a third lower active region 14, and a fourth lower active region 15. The active regions may include first fin active regions 18a and second fin active regions 18b, disposed on the first lower active region 12. Each of the first fin active regions 18a and the second fin active regions 18b may be spaced apart from and parallel to its adjacent one or ones.

The first fin active regions 18a and the second fin active regions 18b may have opposing ends. The active regions may include third fin active regions 21a and fourth fin active regions 21b, disposed on the second lower active region 13. The active regions may include fin active lines 24 and 27, formed on the third lower active region 14 and the fourth lower active region 15, respectively.

The isolation region 6 may include a shallow isolation region 8, and a deep isolation region 10 having a bottom surface deeper than that of the shallow isolation region 8. In an example embodiment of the present inventive concept, the deep isolation region 10 may be referred to as a first isolation region, while the shallow isolation region 8 maybe referred to as a second isolation region. The first isolation region may define the first lower active region 12, the second lower active region 13, the third lower active region 14, and the fourth lower active region 15. The second isolation region may be disposed on the first lower active region 12, the second lower active region 13, the third lower active region 14, and the fourth lower active region 15. The first fin active regions 18a, the second fin active regions 18b, the third fin active regions 21a, the fourth fin active regions 21b, and the fin active lines 24 and 27 may penetrate through the second isolation region and protrude above an upper portion of the second isolation region.

Among the first fin active regions 18a, the second fin active regions 18b, the third fin active regions 21a, the fourth fin active regions 21b, and the fin active lines 24 and 27, a portion may be disposed on a first well region W1 of the semiconductor substrate 3, and a portion may be disposed on a second well region W2 of the semiconductor substrate 3. In detail, the first fin active regions 18a and the second fin active regions 18b on the first lower active region 12, and the fin active lines 24 on the third lower active region 14 may be disposed on the first well region W1, and may have a conductivity type the same as that of the first well region W1, for example, n-type conductivity. The third fin active regions 21a and the fourth fin active regions 21b on the second lower active region 13, and the fin active lines 27 on the fourth lower active region 15 may be disposed on the second well region W2, and may have a conductivity type the same as that of the second well region W2, for example, p-type conductivity.

The semiconductor device 1, according to an example embodiment of the present inventive concept, may include gate structures GS.

The first fin active regions 18a, the second fin active regions 18b, the third fin active regions 21a, the fourth fin active regions 21b, and the fin active lines 24 and 27 may be elongated or may linearly extend in a first direction X. In addition, the gate structures GS may be elongated or may linearly extend in a second direction Y perpendicular to the first direction X, and may cross the fin active regions and the fin active lines described above. The gate structures GS may include a first gate structure GS1, a second gate structure GS2, a third gate structure GS3, a fourth gate structure GS4, a fifth gate structure GS5, and a sixth gate structure GS6. The first gate structures GS1 may overlap the first fin active regions 18a. The second gate structures GS2 may overlap the second fin active regions 18b. The third gate structures GS3 may overlap the third fin active regions 21a. The fourth gate structures GS4 may overlap the fourth fin active regions 21b. The fifth gate structures GS5 may overlap the fin active lines 24 on the third lower active region 14, while the sixth gate structures GS6 may overlap the fin active lines 27 on the fourth lower active region 15.

Each of the gate structures GS may include gate spacers 38, a gate electrode 76 and a gate capping pattern 78 disposed between the gate spacers 38 and stacked in sequence, and a gate dielectric material 74 covering a bottom surface of the gate electrode 76 and extending between the gate electrode 76 and the gate spacers 38. The gate spacers 38 may be formed of an insulating material, such as, for example, silicon oxycarbonitride (SiOCN), silicon oxynitride (SiON), silicon carbonitride (SiCN), silicon nitride (SiN), or the like. The gate capping pattern 78 may be formed of an insulating material, such as silicon nitride, or the like.

The semiconductor device 1, according to an example embodiment of the present inventive concept, may include source/drain regions and contact structures CS on the source/drain regions.

The source/drain regions may include selective epitaxial growth (SEG) patterns formed in recesses of the first fin active regions 18a, the second fin active regions 18b, the third fin active regions 21a, the fourth fin active regions 21b, and the fin active lines 24 and 27. In detail, the source/drain regions may be formed to include at least one SEG pattern of a silicon SEG pattern, a silicon-germanium SEG pattern, and a germanium SEG pattern. The source/drain regions may have one of n-type conductivity and p-type conductivity.

The source/drain regions may include first source/drain regions SD1 formed in recesses 40 of the first fin active region 18a, and second source/drain regions SD2 formed in recesses 40 of the second fin active region 18b.

The source/drain regions may include p-type source/drain regions pSD formed in recesses of the fin active lines 24 on the third lower active region 14, and n-type source/drain regions nSD formed in recesses of the third fin active regions 21a and the fourth fin active regions 21b on the second lower active region 13, and the fin active lines 27 on the fourth lower active region 15.

The first lower active region 12 may include a first Fin Field Effect Transistor (FinFET) TR1 and a second FinFET TR2, disposed thereon. The first FinFET TR1 may include the first source/drain regions SD1 as well as a gate dielectric material 74 and a gate electrode 76 of the first gate structure GS1. The second FinFET TR2 may include the second source/drain regions SD2 as well as a gate dielectric material 74 and a gate electrode 76 of the second gate structure GS2.

Each of the contact structures CS may include a metal silicide layer 95, a barrier layer 96, and a contact plug 97. The barrier layer 96 may cover a side surface and a bottom surface of the contact plug 97. The metal silicide layer 95 may be disposed between the barrier layer 96 and the source/drain regions nSD and pSD. The metal silicide layer 95 may be formed of a material, such as, for example, cobalt silicide (CoSi), nickel silicide (NiSi), titanium silicide (TiSi), or the like. The barrier layer 96 may include a metallic nitride, such as, for example, titanium nitride (TiN), tantalum nitride (TaN), tungsten nitride (WN), or the like. The contact plug 97 may be formed of a metal, such as, for example, tungsten (W), cobalt (Co), titanium (Ti), or the like. Among the contact structures CS, contact structures disposed on the first source/drain regions SD1 may be referred to as first contact structures CS1, while contact structures disposed on the second source/drain regions SD2 may be referred to as second contact structures CS2.

The semiconductor device 1, according to an example embodiment of the present inventive concept, may include an insulating structure INS.

The insulating structure INS may include a lower insulating pattern 55 disposed between the first fin active regions 18a and the second fin active regions 18b, and may include a first upper insulating pattern 88 on the lower insulating pattern 55.

The lower insulating pattern 55 may fill a groove portion 50 disposed between the first fin active regions 18a and the second fin active regions 18b, and may be disposed between the first FinFET TR1 and the second FinFET TR2. The lower insulating pattern 55 may be disposed between the first source/drain region SD1 and the second source/drain region SD2, which are disposed adjacent to each other, and may have a bottom surface lower than that of the recesses 40. That is, the bottom surface of the lower insulating pattern 55 is lower than the bottom surfaces of the first source/drain region SD1 and the second source/drain region SD2. The lower insulating pattern 55 may have an inclined side surface, such that a width thereof is gradually reduced in a direction from an upper portion toward a lower portion.

In an example embodiment of the present inventive concept, the lower insulating pattern 55 may fill the groove portion 50, and may include a portion protruding above an upper portion of the groove portion 50.

In an example embodiment of the present inventive concept, the lower insulating pattern 55 may include a first lower insulating layer 53 and a second lower insulating layer 54. The first lower insulating layer 53 may be provided as an insulating liner formed along an internal wall of the groove portion 50, while the second lower insulating layer 54 may be disposed on the first lower insulating layer 53, and may fill the groove portion 50. In an example embodiment of the present inventive concept, the first lower insulating layer 53 maybe formed of silicon oxide, while the second lower insulating layer 54 may be formed of silicon nitride. The first upper insulating pattern 88 may be wider than the lower insulating pattern 55. The first upper insulating pattern 88 may include first portion overlapping with the first lower active region 12 and second portion overlapping with the first isolation region 10. In the first upper insulating pattern 88, the second portion overlapping with the first isolation region 10 may be wider than the first portion overlapping with the lower active region 12. In addition, the first portion of the first upper insulating pattern 88 may be in contact with the first contact structure CS1 and the second contact structure CS2, and the second portion of the first upper insulating pattern 88 may be in contact with the first gate structure GS1 and the second gate structure GS2. In the first upper insulating pattern 88, the second portion in contact with the first and second gate structures GS1 and GS2 may be wider than the first portion in contact with the first and second contact structures CS1 and CS2.

The insulating structure INS may further include a middle insulating pattern 58 disposed between the first upper insulating pattern 88 and the lower insulating pattern 55, and may include spacer patterns 52 disposed below the middle insulating pattern 58 and on the first source/drain regions SD1 and the second source/drain regions SD2. Thus, the spacer patterns 52 may also be between the upper insulating pattern 88 and both the first source/drain regions SD1 and the second source/drain regions SD2, and/or between the lower insulating pattern 55 and both the first contact structure CS1 and the second contact structure CS2. The first upper insulating pattern 88 may have etching selectivity with respect to the middle insulating pattern 58. In detail, the first upper insulating pattern 88 may be formed of silicon nitride, while the middle insulating pattern 58 may be formed of silicon oxide. The spacer patterns 52 may be formed of a material the same as that of the gate spacers 38. The spacer patterns 52 may be formed of an insulating material different from that of the middle insulating pattern 58. The spacer patterns 52 may have etching selectivity with respect to the middle insulating pattern 58. An etching process may be either for the etching selectivity of silicon nitride with respect to the silicon oxide or for the etching selectivity of silicon oxide with respect to the silicon nitride depending on the choice of etchants used in the etching process. For example, silicon nitride may be selectively etched with respect to silicon oxide with, for example, mixtures of gases including $O_2$ and one or more of fluoromethane ($CH_3F$), tetrafluoromethane ($CF_4$), difluoromethane ($CH_2F_2$), and trifluoromethane ($CHF_3$). Silicon oxide may be selectively etched with respect to silicon nitride with, for example, mixtures of gases including $O_2$, Ar, and one or more of heptafluorocyclopentene ($C_5HF_7$), hexafluorobutadiene ($C_4F_6$), octafluorocyclobutane ($C_4F_8$), and octafluorocyclopentene ($C_5F_8$). In other words, in one etch condition with etchants selectively etching silicon nitride, the first upper insulating pattern 88 may have etching selectivity with respect to the middle insulating pattern 58, and in one other etch condition with etchants selectively etching silicon oxide, the middle insulating pattern 58 may have etching selectivity with respect to the first upper insulating pattern 88. Similarly, in one etch condition, the spacer patterns 52 may have etching selectivity with respect to the middle insulating pattern 58, and in one other etch condition, the middle insulating pattern 58 may have etching selectivity with respect to the spacer patterns 52.

The semiconductor device 1, according to an example embodiment of the present inventive concept, may include interlayer insulating patterns 44 disposed on the first isolation region 10 of the isolation region 6, and may include second upper insulating patterns 89 disposed on the interlayer insulating patterns 44. The second upper insulating patterns 89 may be formed of a material the same as that of the first upper insulating pattern 88. The interlayer insulating patterns 44 may be formed of a material having etching selectivity with respect to the first upper insulating pattern 88, the second upper insulating patterns 89, the gate capping pattern 78, and the gate spacers 38. In detail, the interlayer insulating patterns 44 may be formed of silicon oxide or a silicon oxide-based material, while the first upper insulating pattern 88, the second upper insulating patterns 89, and the gate capping pattern 78 may be formed of an insulating material, such as silicon nitride, or the like, and the gate spacers 38 may be formed of an insulating material, such as, for example, SiOCN, SiON, SiCN, SiN, or the like.

In an example embodiment of the present inventive concept, each of the contact structures (see CS in FIGS. 1 and 2C) may be formed to have a bar shape, in which a length D2 is greater than a width D1 thereof.

In an example embodiment of the present inventive concept, the first contact structures (see CS1 in FIGS. 1 and 2C) may have a first side surface S1 and a second side surface S2 opposing each other, and may have a third side surface S3 and a fourth side surface S4 opposing each other. Among the side surfaces S1, S2, S3, and S4 of the first contact structure CS1, a single side surface (S2) may be in contact with the first gate structure GS1, while three remaining side surfaces S1, S3, and S4 may be in contact with the first upper insulating pattern 88. An upper region of the first contact structure CS1 may be surrounded by the first upper insulating pattern 88 and the first gate structure GS1.

In an example embodiment of the present inventive concept, each of the contact structures CS may be surrounded by the upper insulating patterns 88 and 89 and the gate structures GS. Upper surfaces of the contact structures CS, the upper insulating patterns 88 and 89, and the gate structures GS may be coplanar with each other. Upper portions of the contact structures CS may be surrounded by the upper insulating patterns 88 and 89 and the gate structures GS. To form the contact structures CS, the upper insulating patterns 88 and 89 and the gate structures GS may act as an etching mask in an etching process of forming contact openings. In addition, the upper insulating patterns 88 and 89 and the gate structures GS may play a role in preventing electrical shorts from occurring between the contact structures CS and conductive patterns disposed adjacent thereto.

In an example embodiment of the present inventive concept, the first upper insulating pattern 88 of the insulating structure INS formed on the first lower active region 12 may act as an etching mask in a process of forming a contact, and may play a role in preventing electrical shorts from occurring between the first contact structure CS1 and the second contact structure CS2, which are formed adjacent to each other. Therefore, the insulating structure INS including the first upper insulating pattern 88 may play a role in forming the contact structures CS having a relatively small size. Consequently, higher degree of integration in the semiconductor device may be obtained and reliability may be enhanced.

Figure 5A:
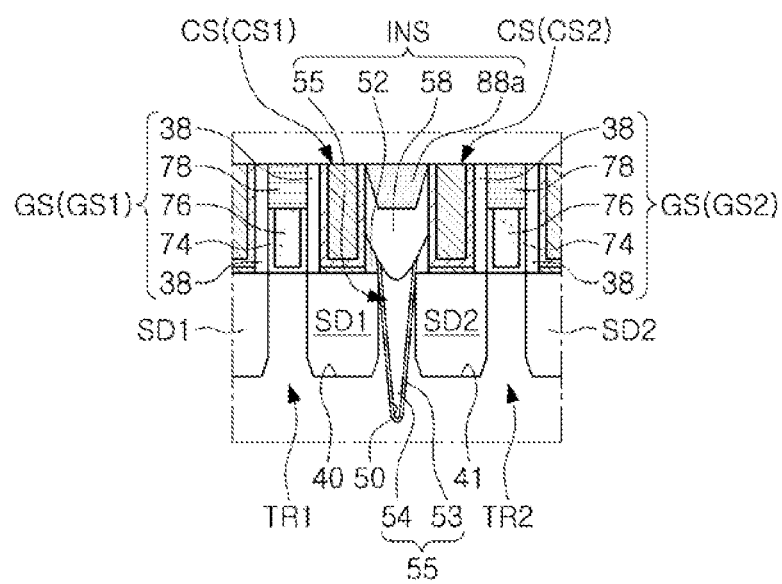
FIGS. 5A to 5C are respective cross-sectional views of modified examples of a semiconductor device according to an example embodiment of the present inventive concept.
Figure 5B:
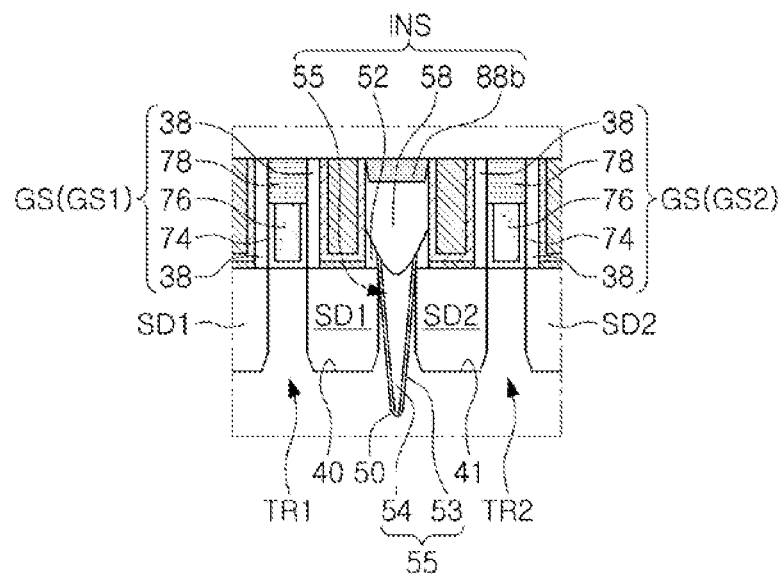
Figure 5C:
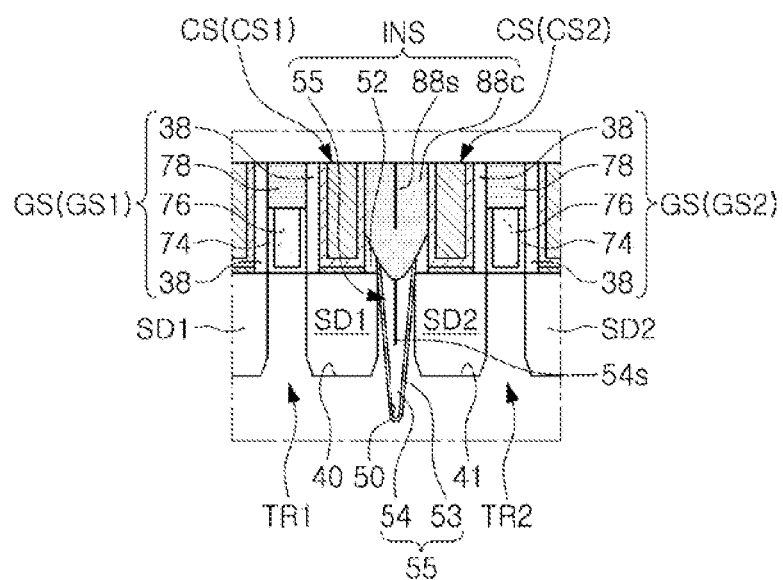

According to an example embodiment of the present inventive concept, the first upper insulating pattern 88 may have a lower surface lower than an upper surface of the gate electrode 76, but the present inventive concept is not limited thereto. For example, the first upper insulating pattern 88 may be modified as a first upper insulating pattern 88a having a lower surface coplanar with the upper surface of the gate electrode 76, as illustrated in FIG. 5A. Alternatively, the first upper insulating pattern 88 may be modified as a first upper insulating pattern 88b having a lower surface higher than the upper surface of the gate electrode 76, as illustrated in FIG. 5B. Alternatively, the first upper insulating pattern 88 may be modified as a first upper insulating pattern 88c having a lower surface lower than the upper surface of the gate electrode 76 and in contact with an upper surface of the lower insulating pattern 55, as illustrated in FIG. 5C. The first upper insulating pattern 88c and the lower insulating pattern 55 may be divided with a seam therein. A seam 54s in the lower insulating pattern 55 may be disposed to be spaced apart from a seam 88s in the first upper insulating pattern 88c, and may not extend into the first upper insulating pattern 88c.

Figure 6A:
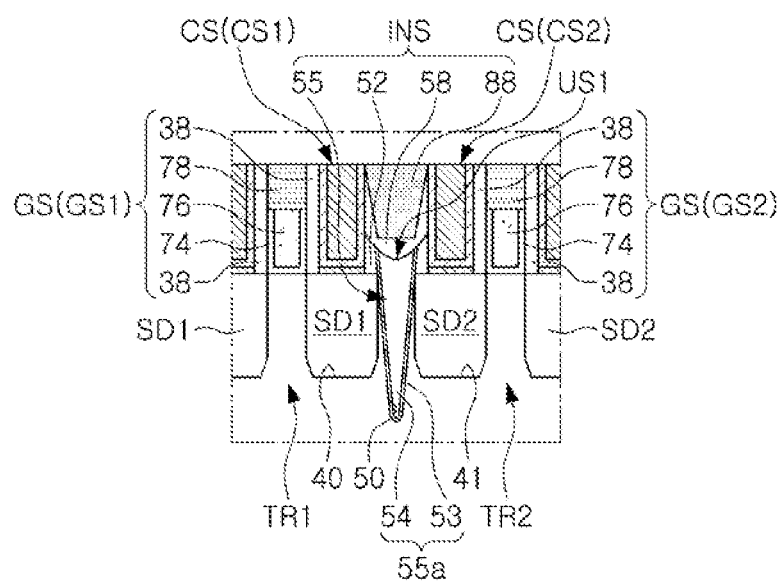
FIGS. 6A to 6C are respective cross-sectional views of different modified examples of a semiconductor device according to an example embodiment of the present inventive concept.
Figure 6B:
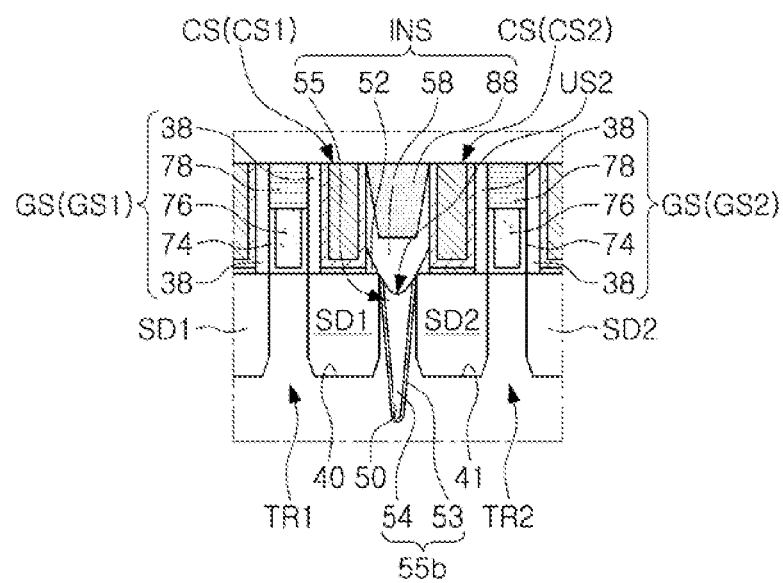

According to an example embodiment of the present inventive concept, the upper surface of the lower insulating pattern 55 may have a downwardly concave shape. A bottom surface of a concave portion in the upper surface of the lower insulating pattern 55 may be disposed on a level substantially the same as that of upper surfaces of the first source/drain regions SD1 and the second source/drain regions SD2, but the present inventive concept is not limited thereto. For example, the lower insulating pattern 55 may be modified as a lower insulating pattern 55a having an upper surface US1 higher than the upper surfaces of the first source/drain regions SD1 and the second source/drain regions SD2, as illustrated in FIG. 6A. Alternatively, the lower insulating pattern 55 may be modified as a lower insulating pattern 55b having an upper surface US2 lower than the upper surfaces of the first source/drain regions SD1 and the second source/drain regions SD2, as illustrated in FIG. 6B.

Figure 6C:
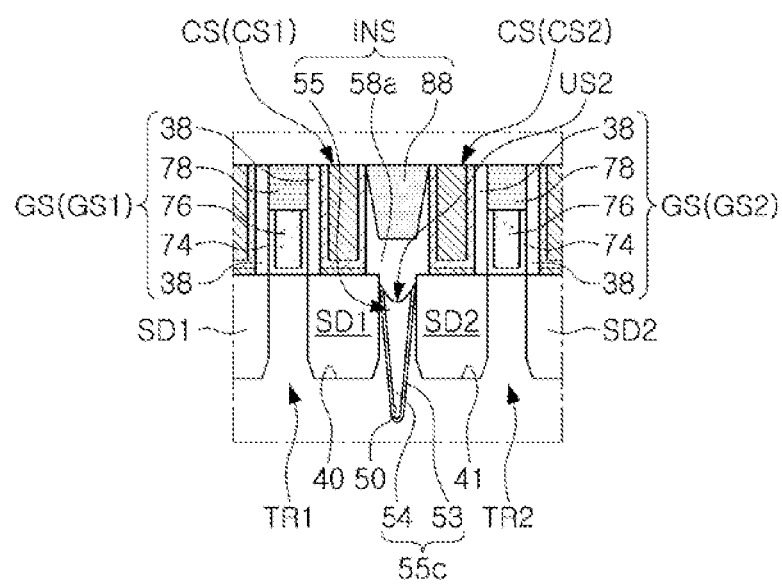

The middle insulating pattern 58, according to an example embodiment of the present inventive concept, may be disposed to be spaced apart from the first source/drain regions SD1 and the second source/drain regions SD2, but the present inventive concept is not limited thereto. For example, the middle insulating pattern 58 may be modified as a middle insulating pattern 58a in contact with the first source/drain regions SD1 and the second source/drain regions SD2, while the lower insulating pattern 55 may be modified as a lower insulating pattern 55c having the upper surface US2 lower than the upper surfaces of the first source/drain regions SD1 and the second source/drain regions SD2, as illustrated in FIG. 6C.

Figure 7A:
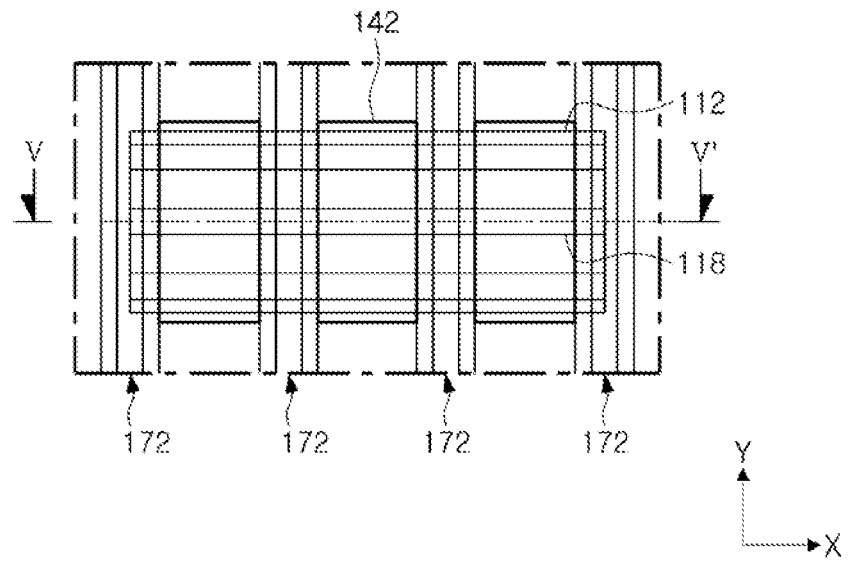
FIGS. 7A, 7B, and 8 are respective views of a different modified example of a semiconductor device according to an example embodiment of the present inventive concept.
Figure 7B:
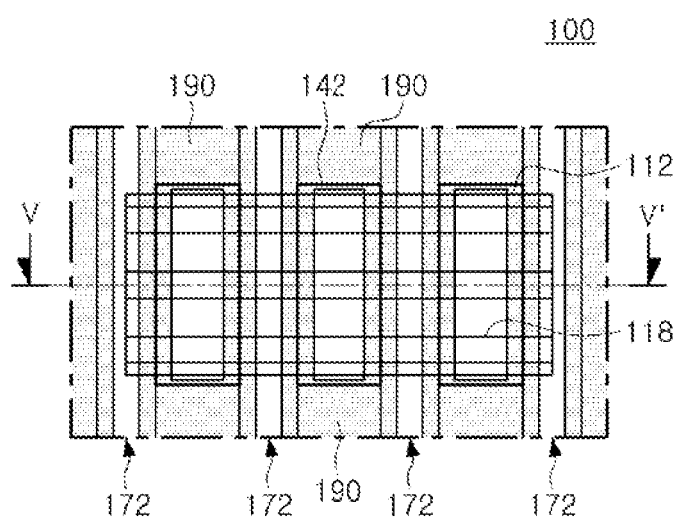
Figure 8:
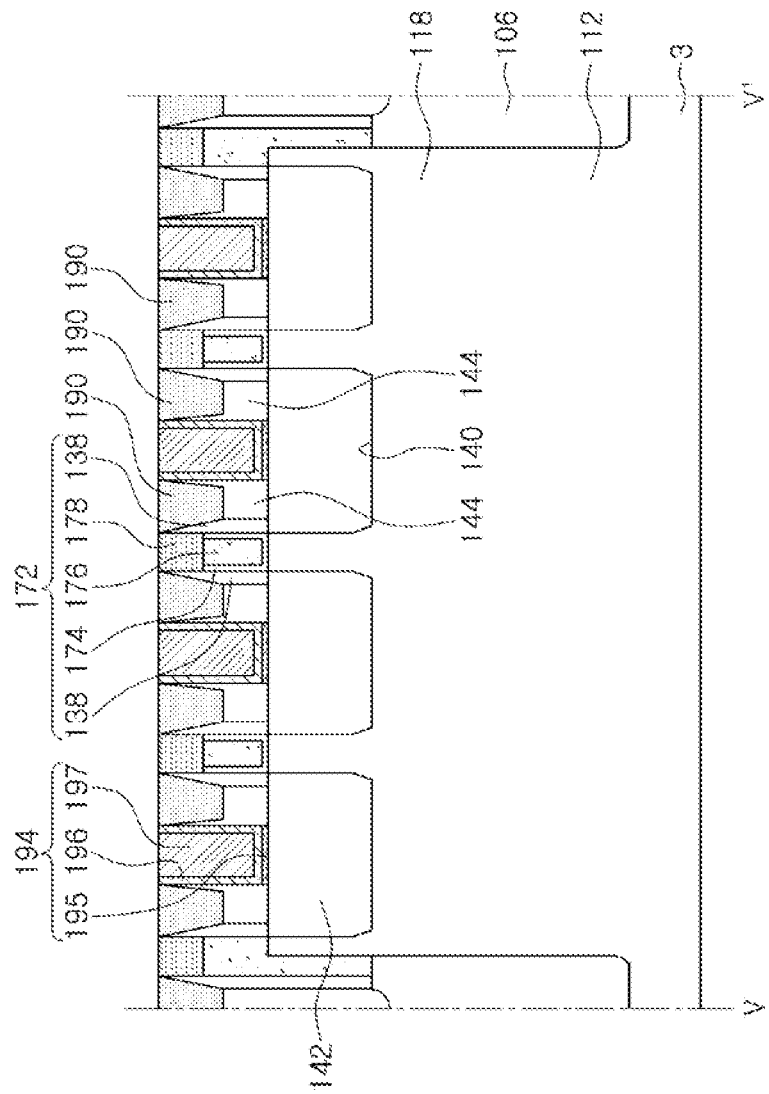

FIGS. 7A and 7B are top views of a semiconductor device 100, a modified example of a semiconductor device according to an example embodiment of the present inventive concept, while FIG. 8 is a cross-sectional view taken along line VI-VI' of FIGS. 7A and 7B.

With reference to FIGS. 7A, 7B, and 8, the semiconductor device 100, according to an example embodiment of the present inventive concept, may include an isolation region 106 disposed on a semiconductor substrate 3 and defining an active region.

The active region may include a different active region 112 and other fin active lines 118, corresponding to the third lower active region 14 and the fin active lines 24, described in FIGS. 1, 2A-2C, 3A-3D and 4, respectively. The isolation region 106 may correspond to the isolation region 6 described in FIGS. 1, 2A-2C, 3A-3D and 4. Other gate structures 172 extending in a direction perpendicular to the direction of the other fin active lines 118 may be disposed.

Each of the other gate structures 172 may include gate spacers 138, a gate electrode 176 and a gate capping pattern 178 disposed between the gate spacers 138 and stacked in sequence, and a gate dielectric material 174 disposed between the gate electrode 176 and the other fin active lines 118 and extending between the gate electrode 176 and the gate spacers 138. An interval or a distance between the other gate structures 172 may be greater than an interval or a distance between the gate structures GS described in FIGS. 1, 2A-2C, 3A-3D and 4.

Recesses 140 of the other fin active lines 118 may include other source/drain regions 142 disposed therein. The other source/drain regions 142 may be wider than the source/drain regions nSD and pSD described in FIGS. 1, 2A-2C, 3A-3D and 4.

Other contact structures 194 maybe disposed on the other source/drain regions 142, and may be disposed between the other gate structures 172. Each of the other contact structures 194 may include a contact plug 197, a barrier layer 196 covering a bottom surface and a side surface of the contact plug 197, and a metal silicide layer 195 disposed below the barrier layer 196 and in contact with the other source/drain regions 142.

Interlayer insulating patterns 144 and upper capping patterns 190 may be disposed between the other contact structures 194 and the other gate structures 172. The upper capping patterns 190 may be disposed on the interlayer insulating patterns 144. In an example embodiment of the present inventive concept, different middle insulating patterns maybe disposed below the upper capping patterns.

Figure 9:
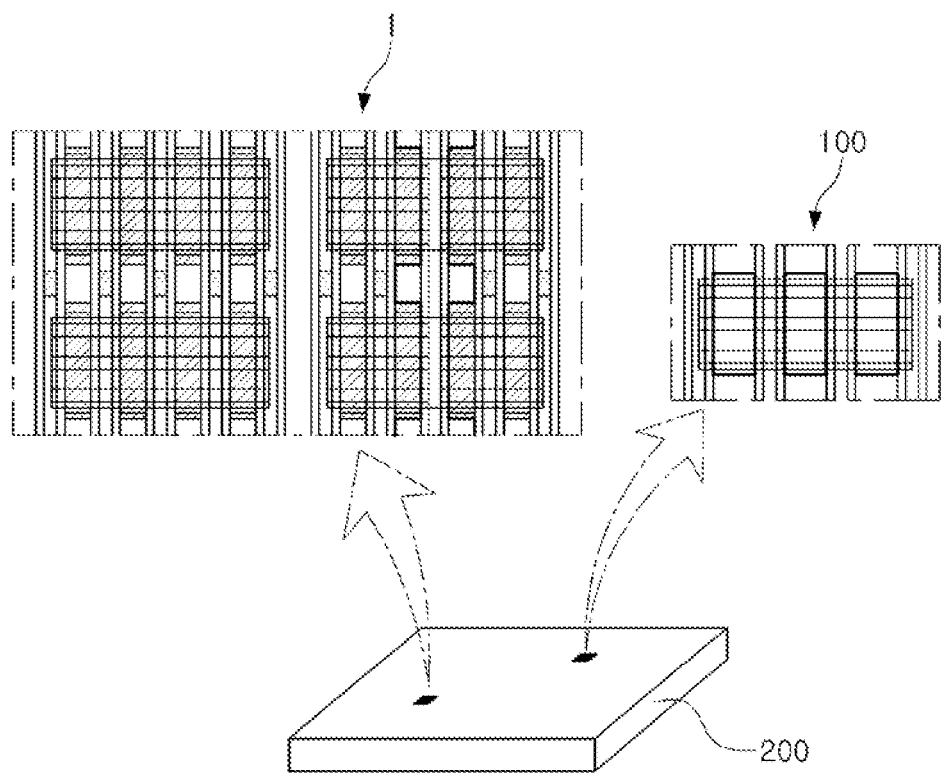
FIG. 9 is a conceptual view of a different modified example of a semiconductor device according to an example embodiment of the present inventive concept.
Figure 10:
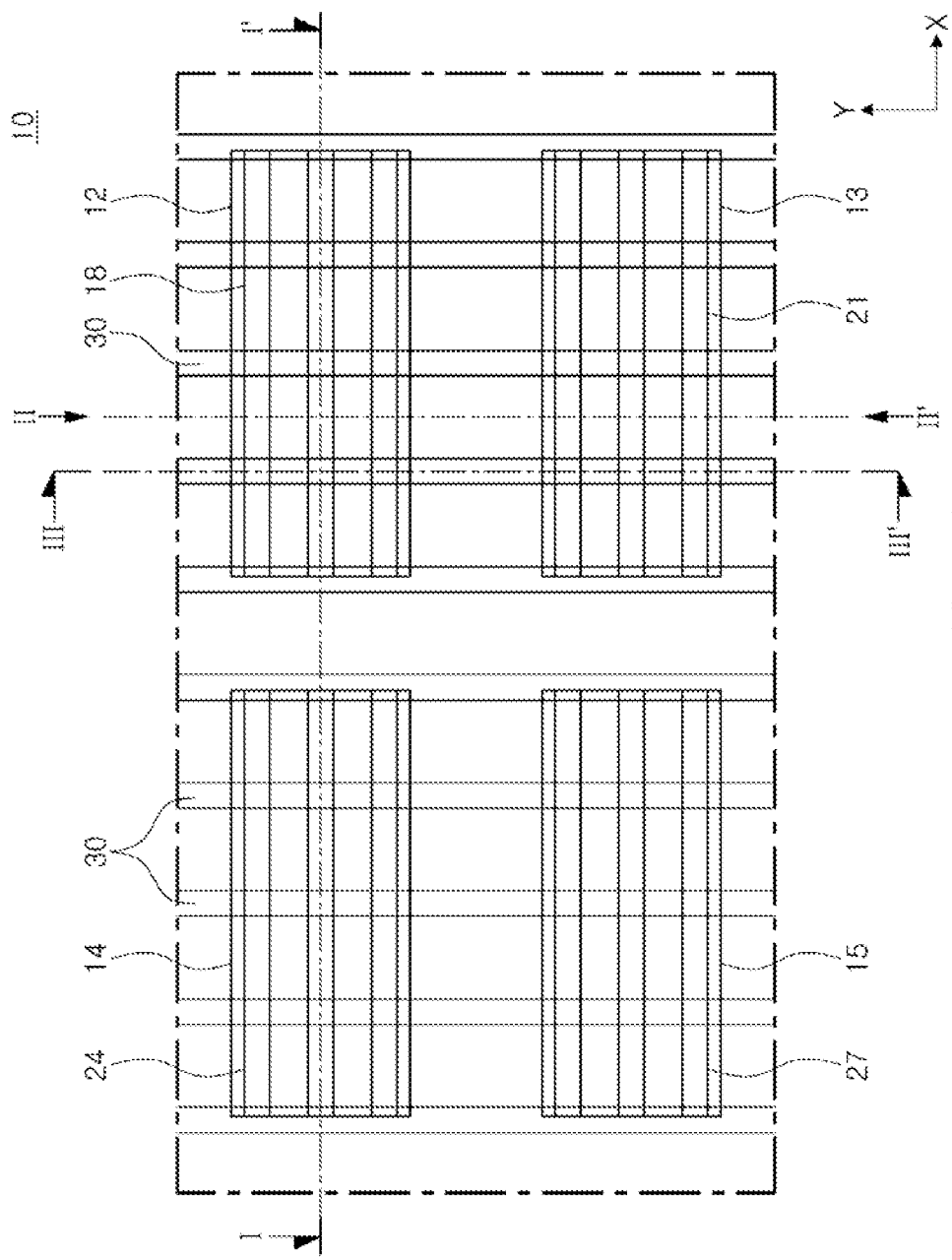
FIGS. 10, 11A-11C, 12, 13A-13C, 14, 15A-15C, 16, 17A-17C, 18, 19A-19C, 20, 21A-21C, 22, 23A-23C, 24, 25A-25C and 26A-26B are views illustrating a method of forming a semiconductor device according to an example embodiment of the present inventive concept.
Figure 11A:
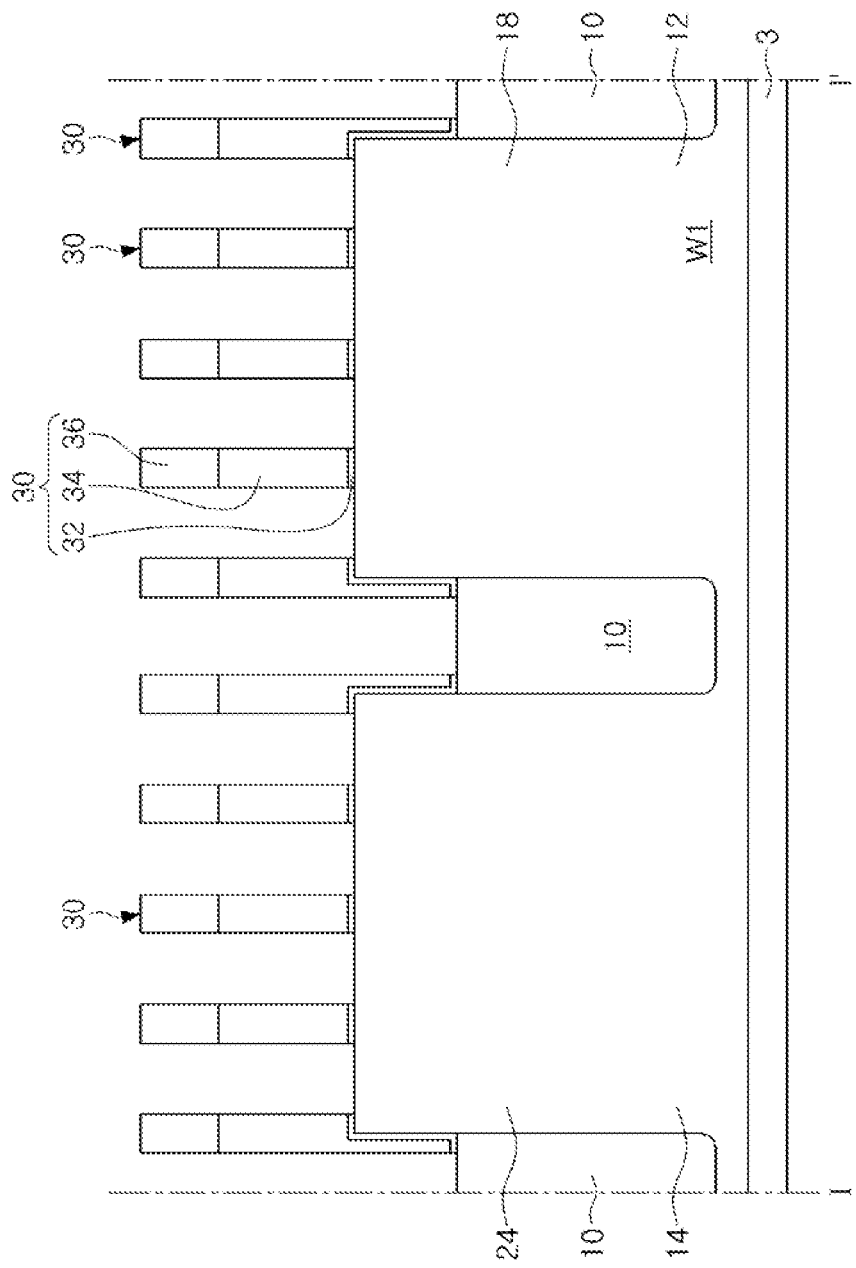
Figure 11B:
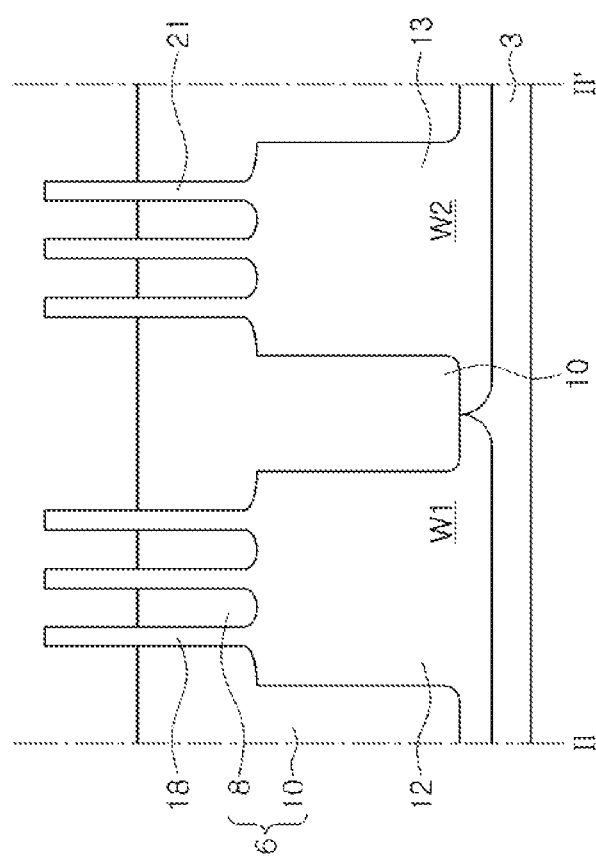
Figure 11C:
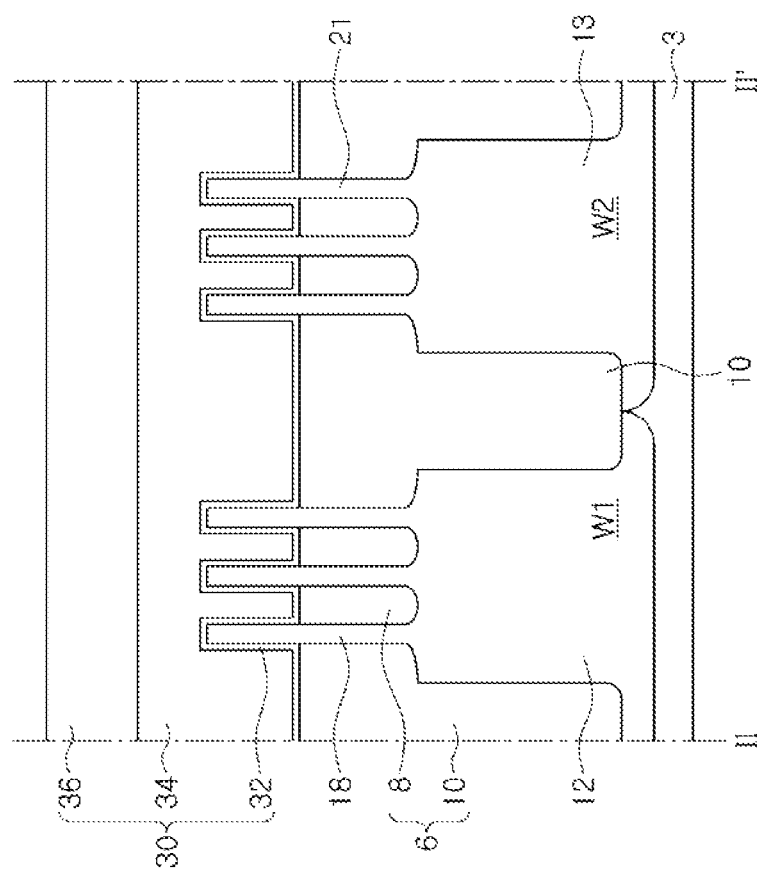
Figure 12:
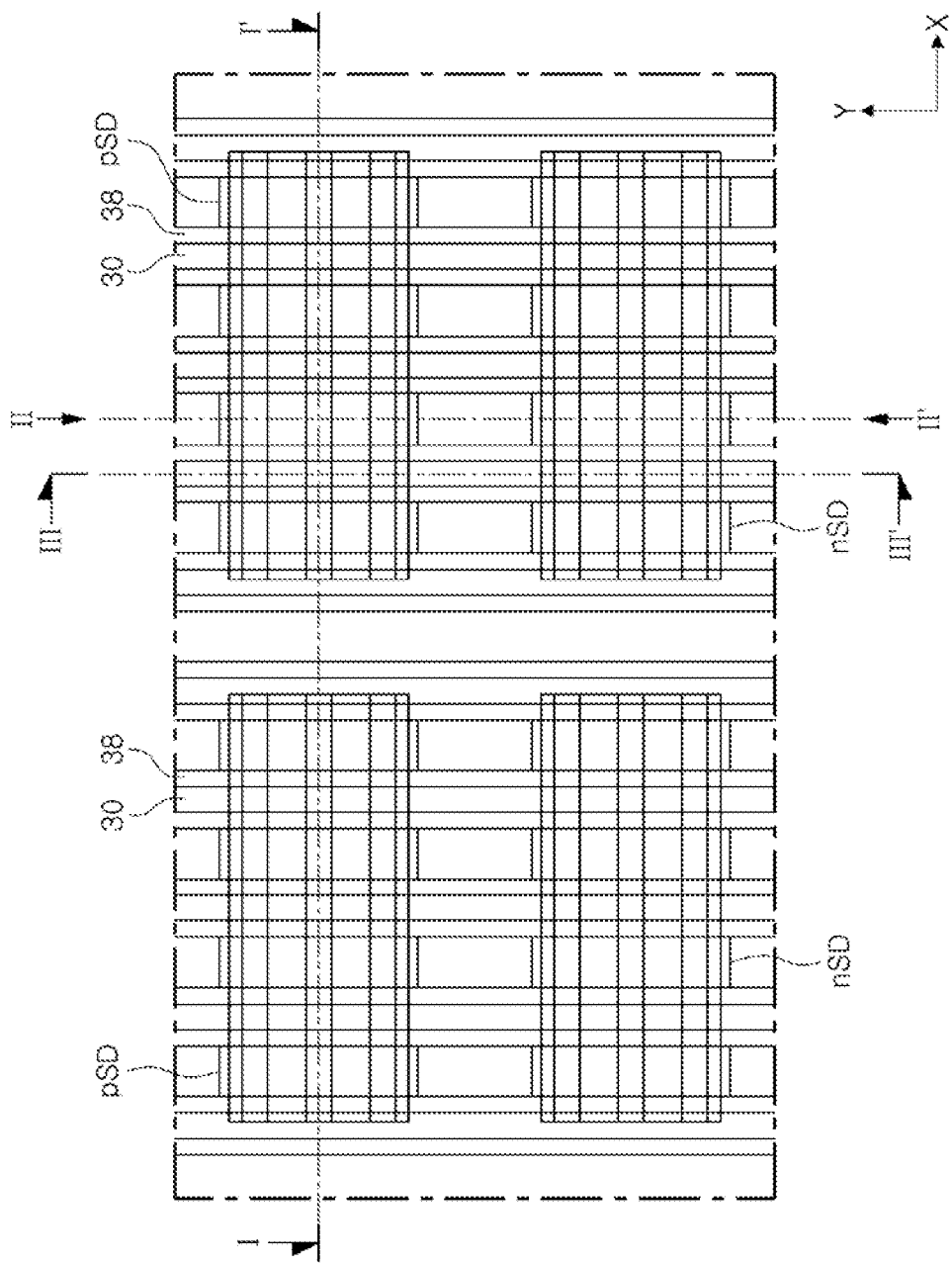
Figure 13A:
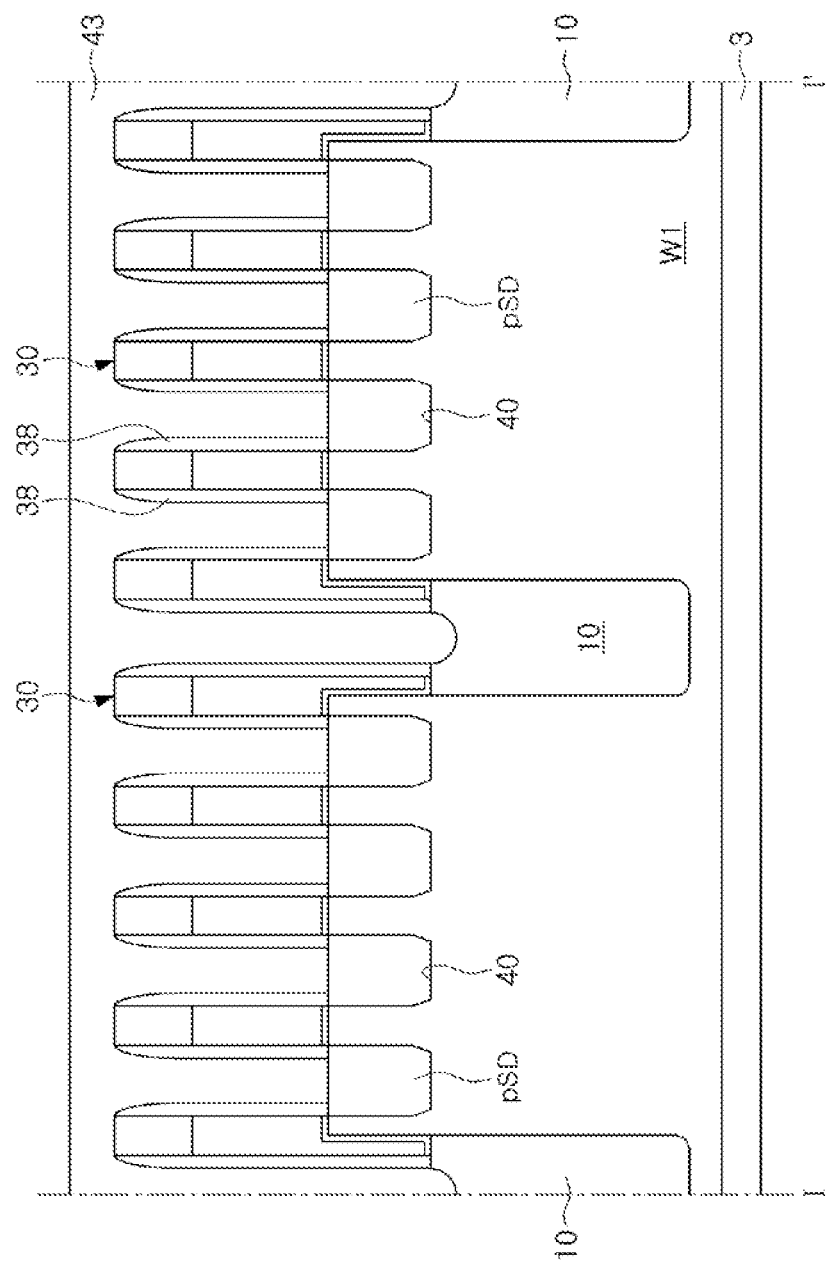
Figure 13B:
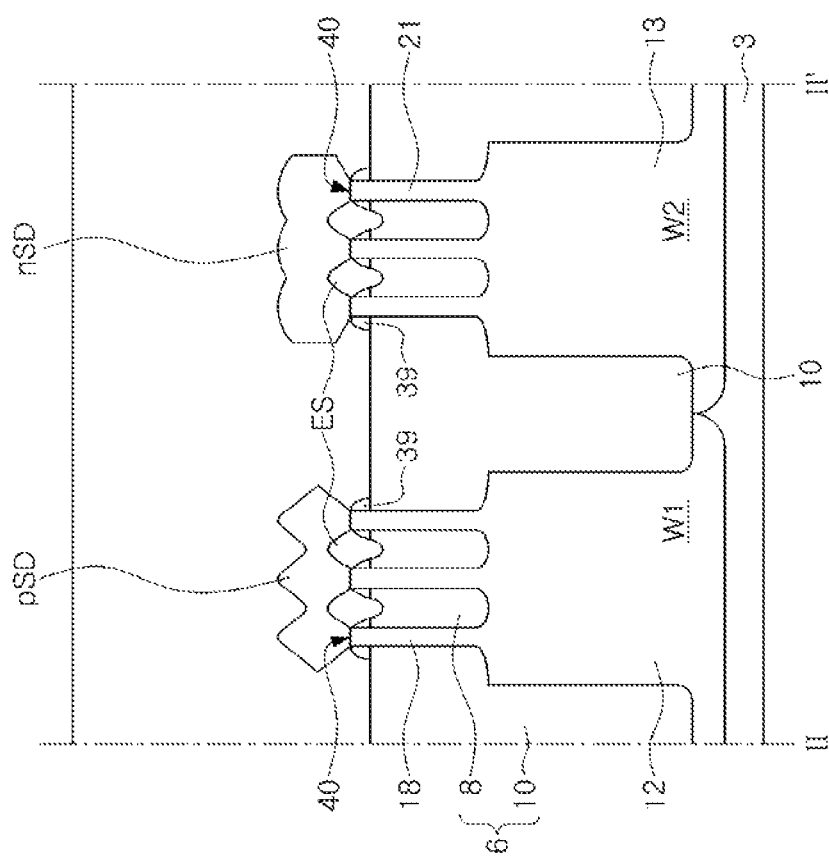
Figure 13C:
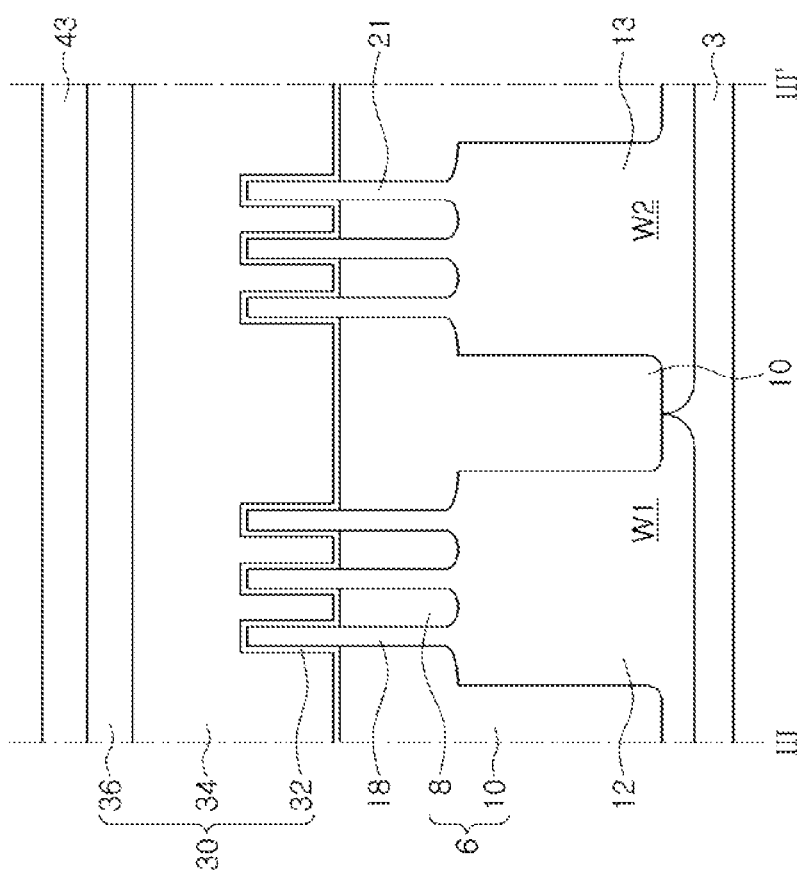
Figure 14:
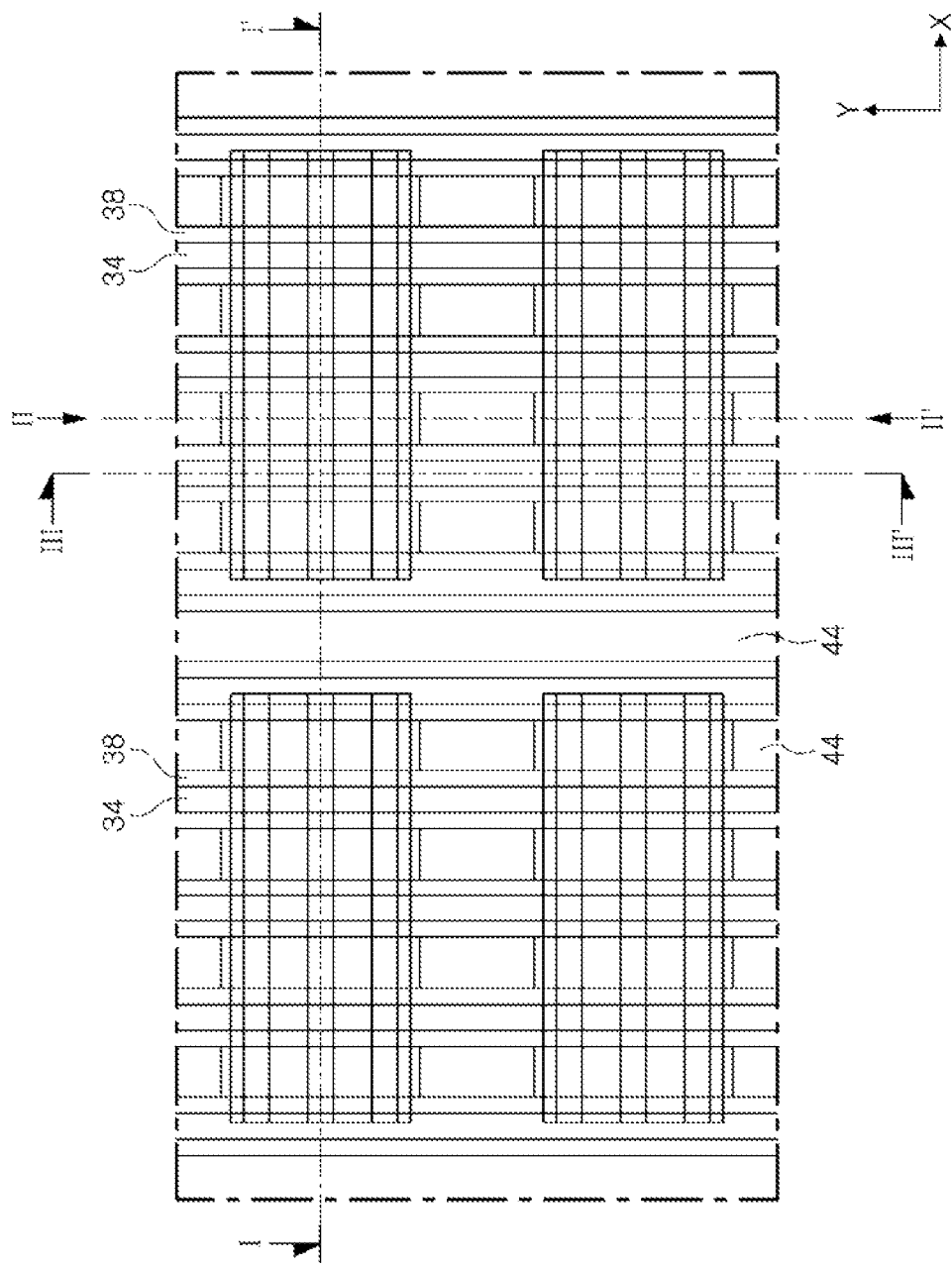
Figure 15A:
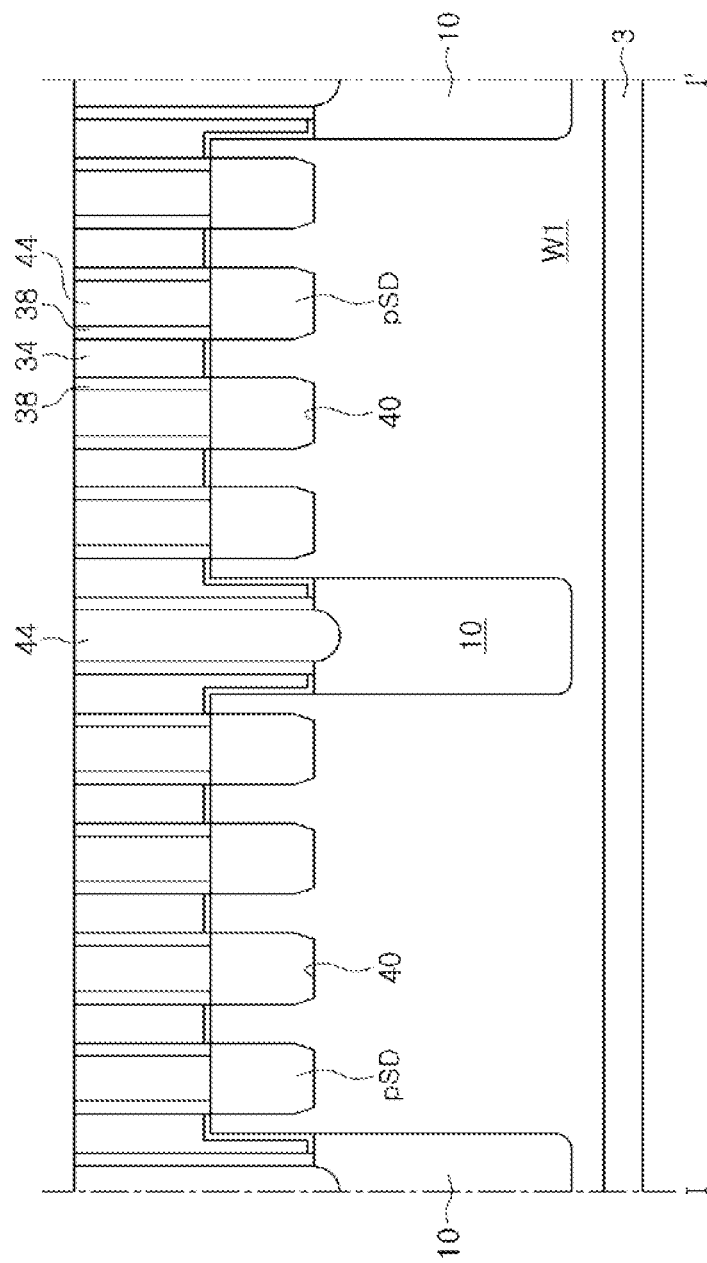
Figure 15B:
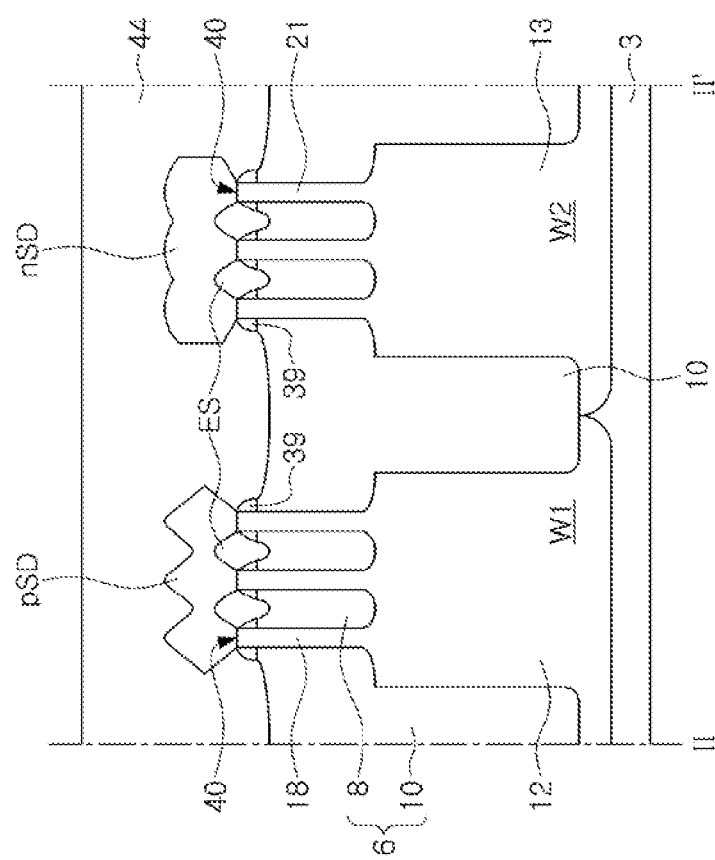
Figure 15C:
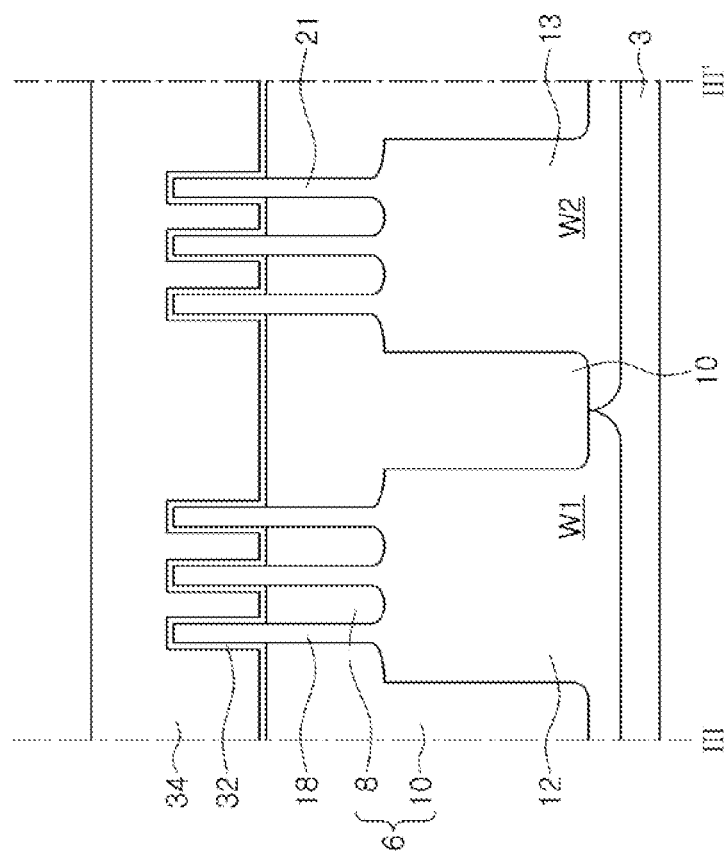
Figure 16:
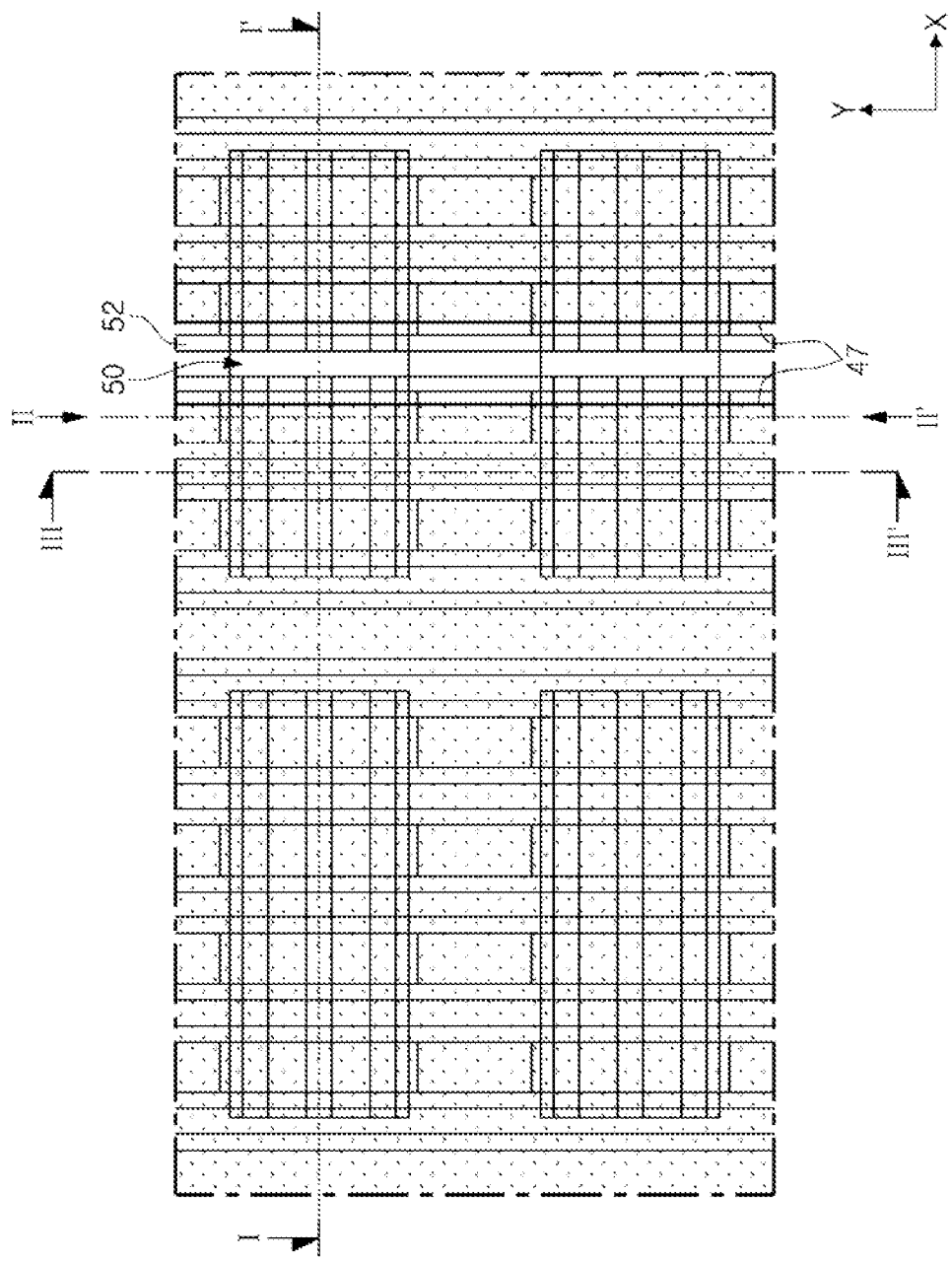
Figure 17A:
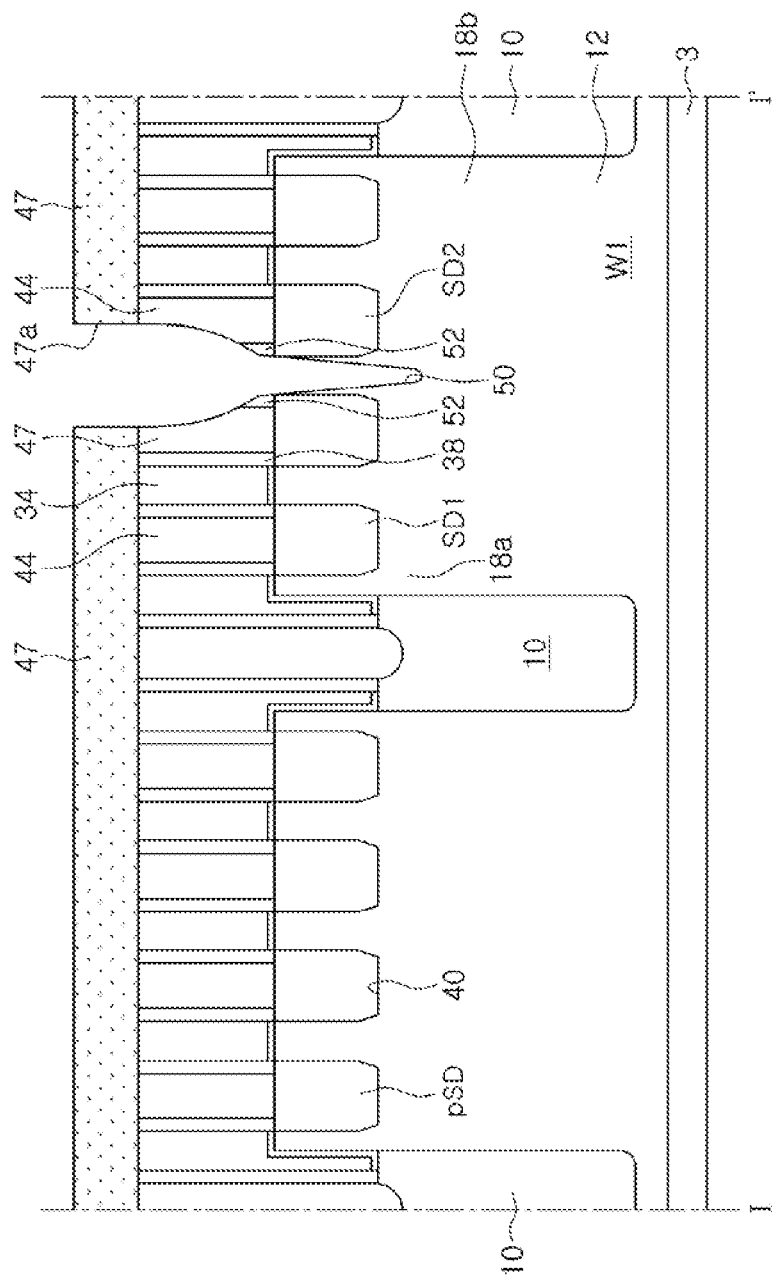
Figure 17B:
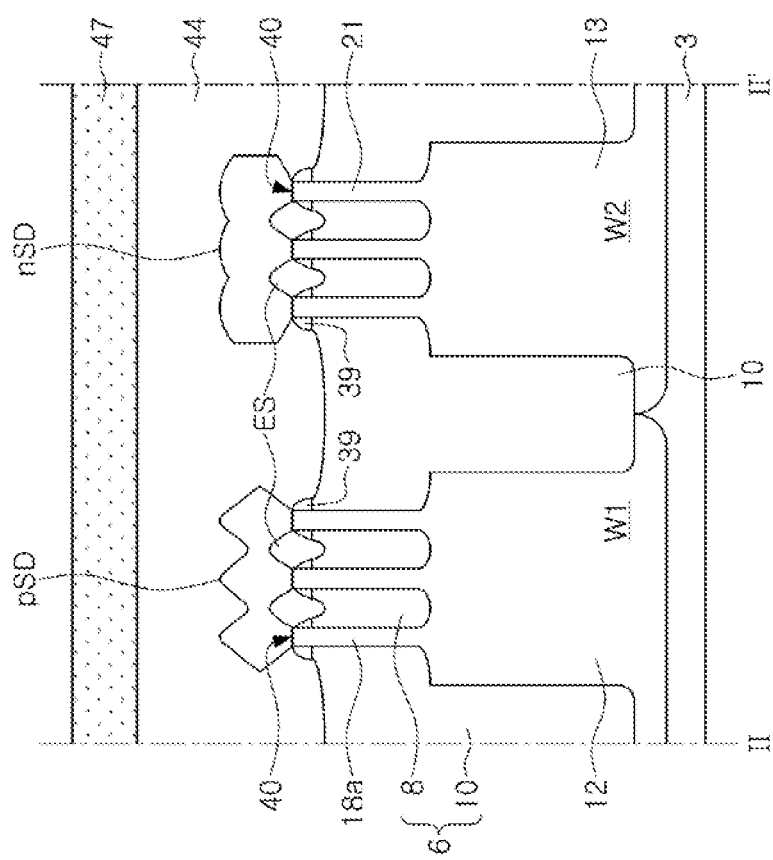
Figure 17C:
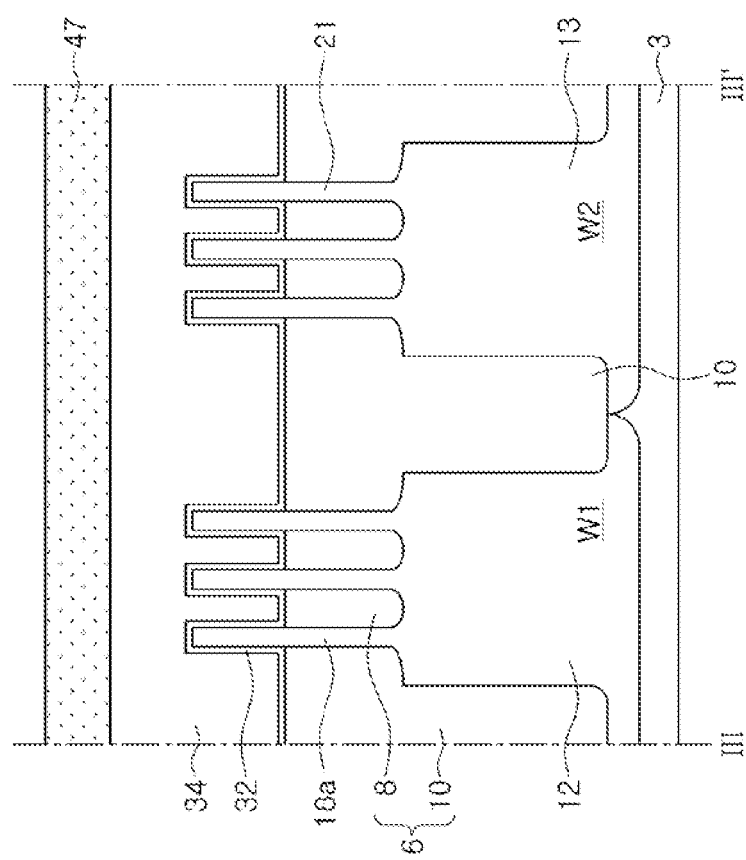
Figure 18:
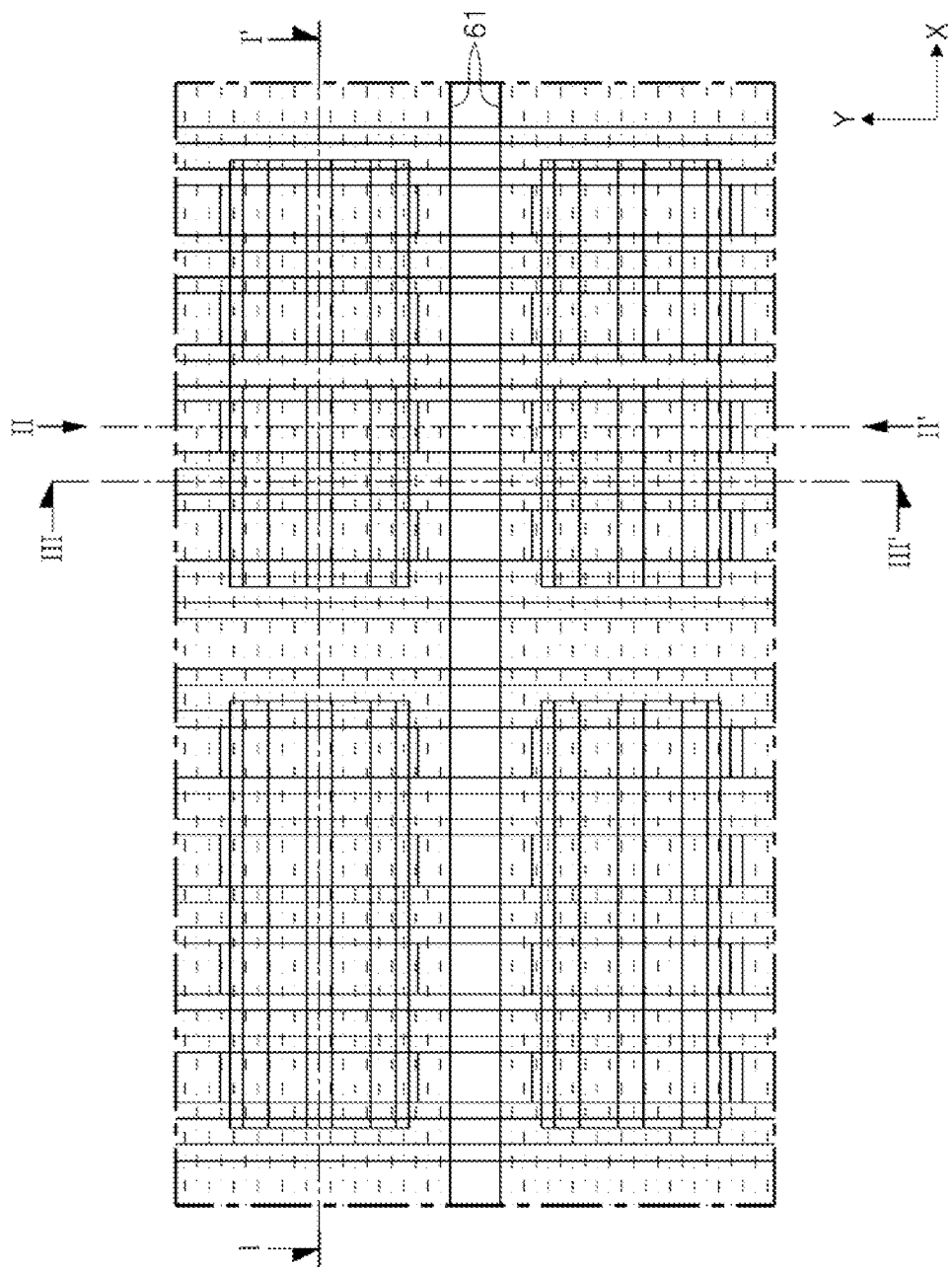
Figure 19A:
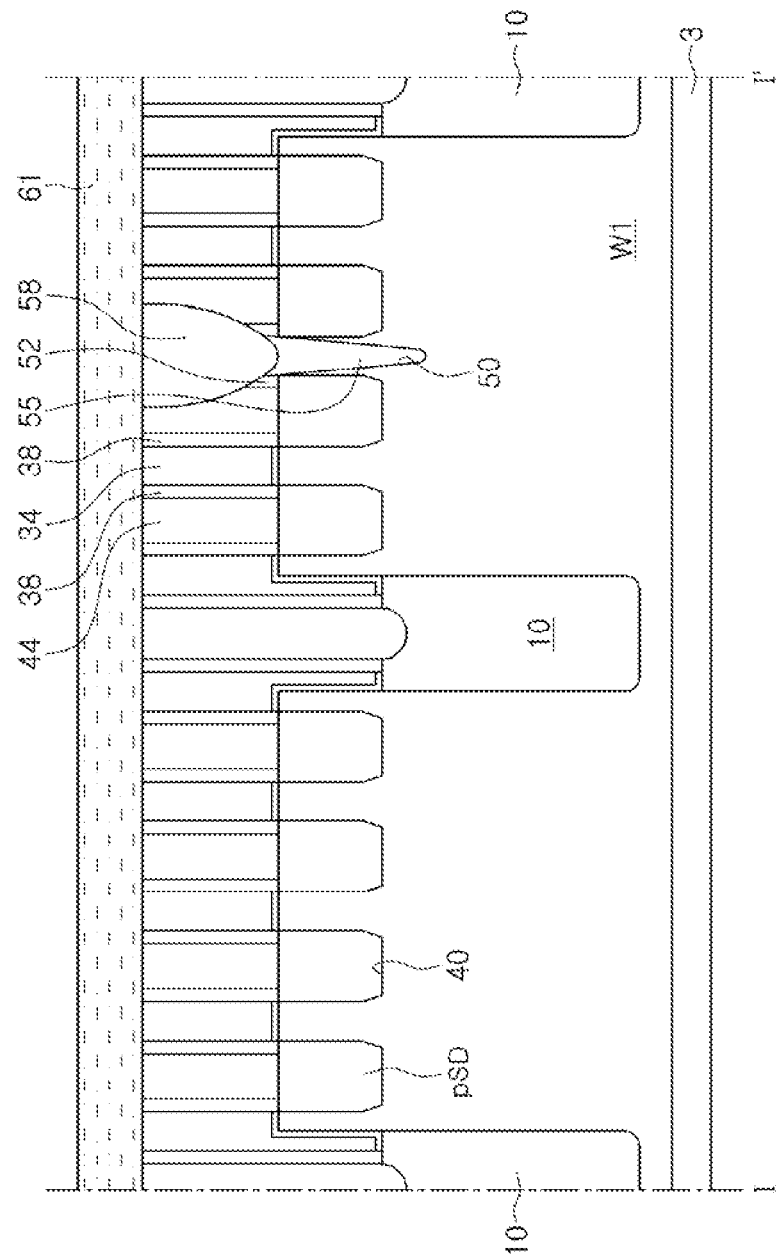
Figure 19B:
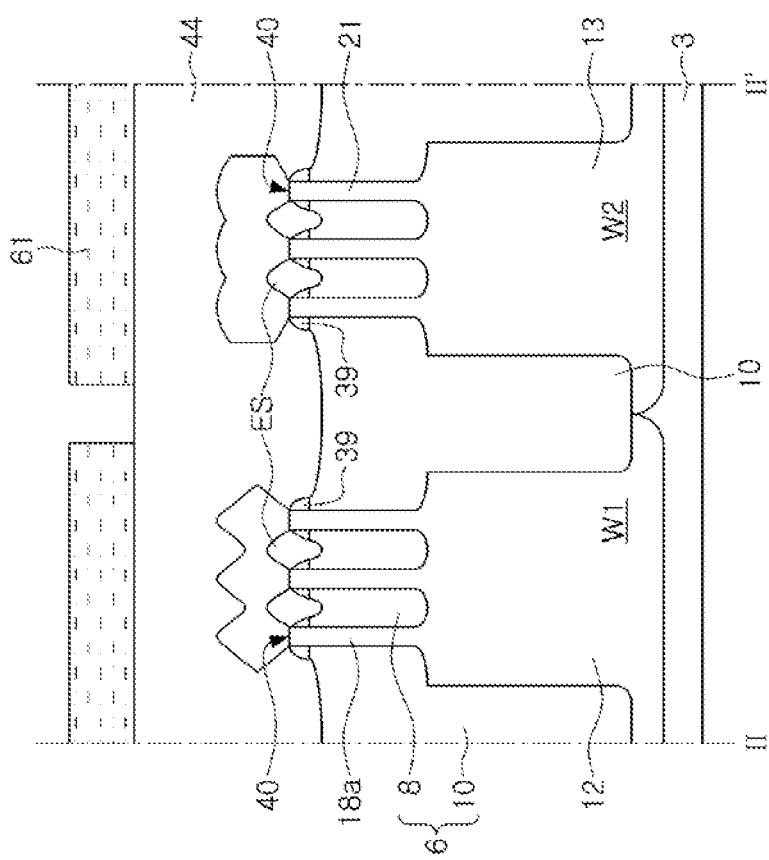
Figure 19C:
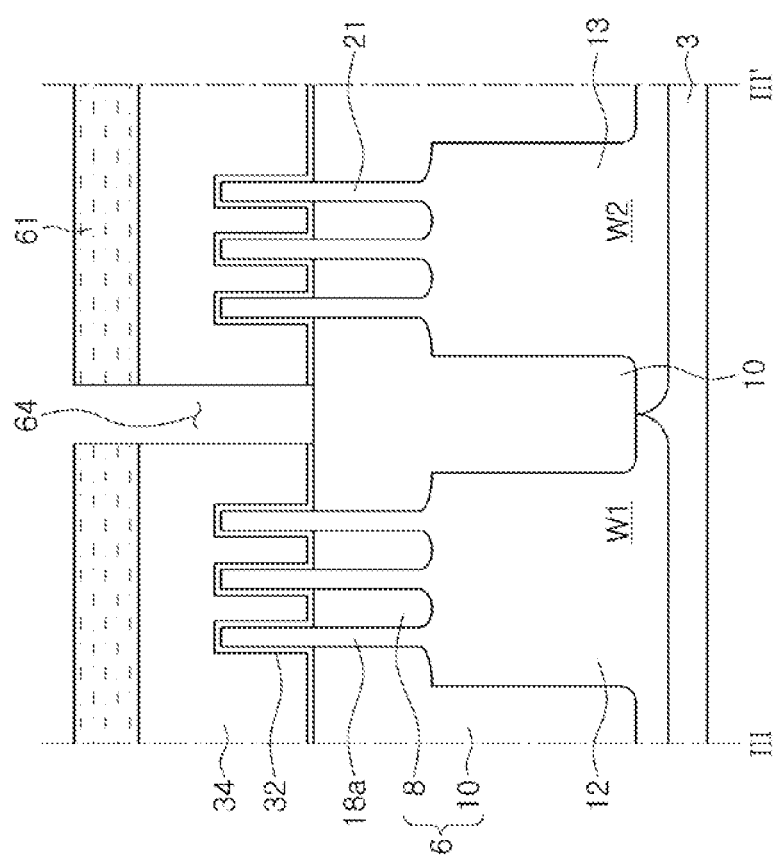
Figure 20:
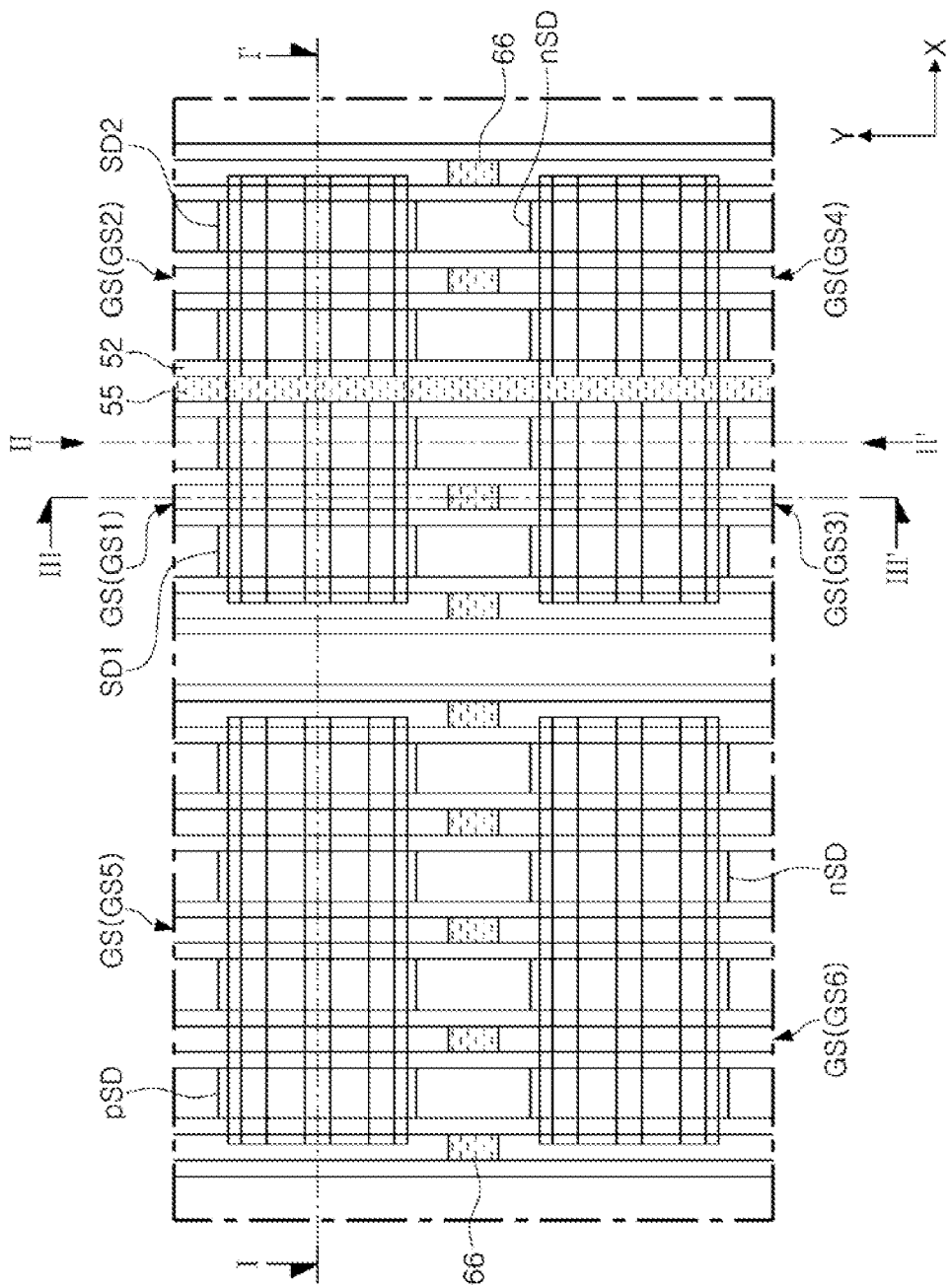

The semiconductor device 1 described in FIGS. 1, 2A-2C, 3A-3D and 4 may be used in an electronic device as a form of a semiconductor chip or a semiconductor package. In addition, the semiconductor device 100 described in FIGS. 7A, 7B, and 8 may be used in an electronic device as a semiconductor chip or a semiconductor package. Referring to FIG. 9, the present inventive concept may comprise a semiconductor device 200 including an entirety of the semiconductor device 1 described in FIGS. 1, 2A-2C, 3A-3D and 4 and the semiconductor device 100 described in FIGS. 7A, 7B, and 8. The semiconductor device 200 may be used in an electronic device in a form of a single semiconductor chip or a single semiconductor package. In detail, the semiconductor device 1, described in FIGS. 1, 2A-2C, 3A-3D and 4, may be disposed in a first device region of the semiconductor device 200, while the semiconductor device 100, described in FIGS. 7A, 7B, and 8, may be disposed in a second device region of the semiconductor device 200 as illustrated in FIG. 9.

An example of a method of forming a semiconductor device, according to an example embodiment of the present inventive concept, will be described with reference to FIGS. 10, 11A-11C, 12, 13A-13C, 14, 15A-15C, 16, 17A-17C, 18, 19A-19C, 20, 21A-21C, 22, 23A-23C, 24, 25A-25C and 26A-26B.

In FIGS. 10, 11A-11C, 12, 13A-13C, 14, 15A-15C, 16, 17A-17C, 18, 19A-19C, 20, 21A-21C, 22, 23A-23C, 24, 25A-25C and 26A-26B, FIGS. 10, 12, 14, 16, 18, 20, 22, and 24 are top views illustrating an example of the method of forming a semiconductor device according to an example embodiment of the present inventive concept; FIGS. 11A, 13A, 15A, 17A, 19A, 21A, 23A, 25A, and 26A are cross-sectional views taken along line I-I' of the corresponding top views; FIGS. 11B, 13B, 15B, 17B, 19B, 21B, 23B, 25B, and 26B are cross-sectional views taken along line II-II' of the corresponding top views; and FIGS. 11C, 13C, 15C, 17C, 19C, 21C, 23C, and 25C are cross-sectional views taken along line III-III' of the corresponding top views.

With reference to FIGS. 10, 11A, 11B, and 11C, an isolation region 6 defining active regions on a semiconductor substrate 3 may be formed. The semiconductor substrate 3 may be formed of a semiconductor material, such as silicon (Si), or the like. The active regions may include a first lower active region 12, a second lower active region 13, a third lower active region 14, and a fourth lower active region 15, disposed on the semiconductor substrate 3 and spaced apart from each other, and may include a first fin active line 18, a second fin active line 21, a third fin active line 24, and a fourth fin active line 27, disposed on the first lower active region 12, the second lower active region 13, the third lower active region 14, and the fourth lower active region 15, respectively.

The isolation region 6 may include a shallow isolation region 8, and a deep isolation region 10 having a bottom surface deeper than that of the shallow isolation region 8. The shallow isolation region 8 may be disposed on the first lower active region 12, the second lower active region 13, the third lower active region 14, and the fourth lower active region 15. The first fin active line 18, the second fin active line 21, the third fin active line 24, and the fourth fin active line 27 may penetrate through the shallow isolation region 8 and protrude above an upper portion of the shallow isolation region 8. The deep isolation region 10 may be disposed between any adjacent two of the first lower active region 12, the second lower active region 13, the third lower active region 14, and the fourth lower active region 15.

In an example embodiment of the present inventive concept, each of the first fin active line 18, the second fin active line 21, the third fin active line 24, and the fourth fin active line 27 may be formed to have n-type or p-type conductivity according to a circuit component. In detail, the first lower active region 12, the third lower active region 14, the first fin active line 18, and the third fin active line 24 maybe formed on a first well region W1 of the semiconductor substrate 3. In addition, the second lower active region 13, the fourth lower active region 15, the second fin active line 21, and the fourth fin active line 27 may be formed on a second well region W2 of the semiconductor substrate 3. One of the first well region W1 and the second well region W2 may be provided as a p-well region, while the other may be provided as an n-well region.

Sacrificial gate patterns 30 may be formed on the first fin active line 18, the second fin active line 21, the third fin active line 24, the fourth fin active line 27, and the isolation region 6. Each of the sacrificial gate patterns 30 may include a sacrificial insulating layer 32, a sacrificial gate layer 34, and a sacrificial mask layer 36, stacked in sequence. The first fin active line 18, the second fin active line 21, the third fin active line 24, and the fourth fin active line 27 may linearly extend in a first direction X. In addition, the sacrificial gate patterns 30 may linearly extend in a second direction Y, perpendicular to the first direction X, and may cross the first, second, third, and fourth fin active lines 18, 21, 24 and 27.

In an example embodiment of the present inventive concept, end portions of the first fin active line 18, the second fin active line 21, the third fin active line 24, and the fourth fin active line 27 may be covered by the sacrificial gate patterns 30.

With reference to FIGS. 12, 13A, 13B, and 13C, gate spacers 38 maybe formed on side surfaces of the sacrificial gate patterns 30. The gate spacers 38 may be formed of an insulating material, such as, for example, SiOCN, SiON, SiCN, SiN, or the like.

The first fin active line 18, the second fin active line 21, the third fin active line 24, and the fourth fin active line 27 may include source/drain regions nSD and pSD formed thereon. Forming the source/drain regions nSD and pSD may include forming recesses 40 in such a manner that the first fin active line 18, the second fin active line 21, the third fin active line 24, and the fourth fin active line 27 are etched, and may include forming epitaxial layers in the recesses 40 by performing an SEG process. The epitaxial layers may be doped with an in-situ process. The source/drain regions nSD and pSD may include n-type source/drain regions nSD and p-type source/drain regions pSD. The p-type source/drain regions pSD may be formed on fin active regions having n-type conductivity, such as recesses 40 of the first fin active line 18 and the third fin active line 24. The n-type source/drain regions nSD may be formed on fin active regions having p-type conductivity, such as recesses 40 of the second fin active line 21 and the fourth fin active line 27. The p-type source/drain regions pSD may be formed before or after the n-type source/drain regions nSD are formed. The source/drain regions pSD and nSD may be formed to have a bar shape extending in a direction of intersecting with fin active lines, and may overlap the shallow isolation region 8. Empty spaces (see ES in FIG. 13B) may be formed between the source/drain regions pSD and nSD and the shallow isolation region 8.

In an example embodiment of the present inventive concept, remaining spacers (see 39 in FIG. 13B) may be formed on side surfaces of the fin active lines below a bottom surface of the recesses 40, but the present inventive concept is not limited thereto. For example, the remaining spacers 39 may be removed while the recesses 40 are being formed.

An interlayer insulating layer 43 may be formed on a semiconductor substrate including the p-type source/drain regions pSD and the n-type source/drain regions nSD. The interlayer insulating layer 43 may fill gaps between the sacrificial gate patterns 30. The interlayer insulating layer 43 may be formed of silicon oxide.

With reference to FIGS. 14, 15A, 15B, and 15C, interlayer insulating patterns 44 may be formed in such a manner that the interlayer insulating layer (see 43 in FIGS. 13A, 13B, and 13C) is polished until the sacrificial gate layers 34 are exposed. The interlayer insulating layer (see 43 in FIGS. 13A, 13B, and 13C) may be polished, and the sacrificial mask layers 36 may be removed.

With reference to FIGS. 16, 17A, 17B, and 17C, a first mask pattern 47 including a first opening 47a may be formed on the semiconductor substrate including the interlayer insulating patterns 44. The first opening 47a may be formed in a linear manner, and may allow a portion of the sacrificial gate layers 34 to be exposed.

A sacrificial gate layer that is exposed, among the sacrificial gate layers 34, maybe etched and removed using the first mask pattern 47 as an etching mask, and a fin active line below the removed sacrificial gate layer may be etched, thus forming a groove portion 50.

In an example embodiment of the present inventive concept, the groove portion 50 may intersect the first fin active lines 18. The first fin active lines 18 may be divided into first fin active regions 18*a* and second fin active regions 18*b* by the groove portion 50.

In an example embodiment of the present inventive concept, the groove portion 50 may intersect the second fin active lines 21. The second fin active lines 21 may be divided into third fin active regions 21*a* and fourth fin active regions 21*b* by the groove portion 50.

In an example embodiment of the present inventive concept, the groove portion 50 maybe formed, and a portion of a gate spacer may be etched, so that spacer patterns 52, which have been lowered, may remain. Thus, the spacer patterns 52 may have heights smaller than heights of gate spacers 38. Subsequently, the first mask pattern 47 may be removed.

With reference to FIGS. 18, 19A, 19B, and 19C, the groove portion 50 may include a lower insulating pattern 55 formed therein. Forming the lower insulating pattern 55 may include forming a lower insulating layer on the semiconductor substrate including the groove portion 50, and may include etching the lower insulating layer.

In an example embodiment of the present inventive concept, the lower insulating pattern 55 may be formed of silicon nitride. Alternatively, the lower insulating pattern 55 may be formed of an oxide liner and silicon nitride on the oxide liner.

The lower insulating pattern 55 may be formed to have one upper surface of the upper surfaces US1 and US2, described in FIGS. 6A to 6C, in such a manner that a process of etching the lower insulating layer is controlled.

The lower insulating pattern 55 may include a middle insulating pattern 58 formed thereon. The middle insulating pattern 58 may be formed of a material having etching selectivity different from that of the lower insulating pattern 55. In detail, the lower insulating pattern 55 may be formed of silicon nitride, while the middle insulating pattern 58 may be formed of a silicon oxide-based insulating material.

The sacrificial gate layers 34 may be formed in a linear manner, and a second mask pattern 61, which includes an opening extending in a perpendicular direction, may be formed on the semiconductor substrate including the middle insulating pattern 58.

The opening of the second mask pattern 61 may be formed on the isolation region 10 between the first active region 12 and the second active region 13, which have different polarities, and may be formed on the isolation region 10 between the third active region 14 and the fourth active region 15, which have different polarities.

Holes 64 may be formed in such a manner that the sacrificial gate layers 34 are selectively etched using the second mask pattern 61 as an etching mask.

With reference to FIGS. 20, 21A, 21B, and 21C, gate isolation patterns 66 filling the holes 64 may be formed. The second mask pattern 61 may be removed while the gate isolation patterns 66 are being formed or before the gate isolation patterns 66 are formed.

In an example embodiment of the present inventive concept, the gate isolation patterns 66 may be formed of silicon nitride, but the present inventive concept is not limited thereto. For example, the gate isolation patterns 66 may be formed of an oxide-based material.

Gate trenches may be formed in such a manner that the sacrificial gate layers 34 and the sacrificial insulating layers 32 are removed. In addition, the gate trenches may include a gate dielectric material 74, a gate electrode 76, and a gate capping pattern 78 formed therein. The gate dielectric material 74 may cover a bottom surface and a side surface of the gate electrode 76. The gate capping pattern 78 may be formed on the gate electrode 76. The gate capping pattern 78 may be formed of silicon nitride.

In an example embodiment of the present inventive concept, the gate dielectric material 74, the gate electrode 76, the gate capping pattern 78, and the gate spacers 38 may be configured to form gate structures GS.

With reference to FIGS. 22, 23A, 23B, and 23C, an upper layer 81 maybe formed on the semiconductor substrate including gate structures GS. The upper layer 81 may be formed of silicon oxide.

Third mask patterns 83 may be formed on the upper layer 81. The third mask patterns 83 may overlap the first lower active region 12, the second lower active region 13, the third lower active region 14, and the fourth lower active region 15. Upper recesses 85 may be formed in such a manner that the upper layer 81, the interlayer insulating patterns 44, and the middle insulating pattern 58 are etched using the third mask patterns 83 as an etching mask. Bottom surfaces of the upper recesses 85 may be lower than upper surfaces of the gate capping patterns 78.

A position of the bottom surfaces of the upper recesses 85 disposed to be lower than the upper surfaces of the gate capping patterns 78 may be controlled by an etching process in which the third mask patterns 83 are used as an etching mask. The third mask patterns 83 may be removed during or after the etching process.

With reference to FIGS. 24, 25A, 25B, and 25C, upper insulating patterns 88 and 89 remaining in the upper recesses (see 85 in FIGS. 23A to 23C) may be formed in such a manner that an upper insulating layer is formed on the semiconductor substrate including the upper recesses 85, and the upper insulating layer is polished. Polishing the upper insulating layer may include polishing the upper insulating layer until upper surfaces of the gate structures GS are exposed. In an example embodiment of the present inventive concept, the upper insulating layer may be polished by a chemical mechanical polishing process. The upper layer 81 may be removed while the upper insulating layer is being polished.

Figure 26A:
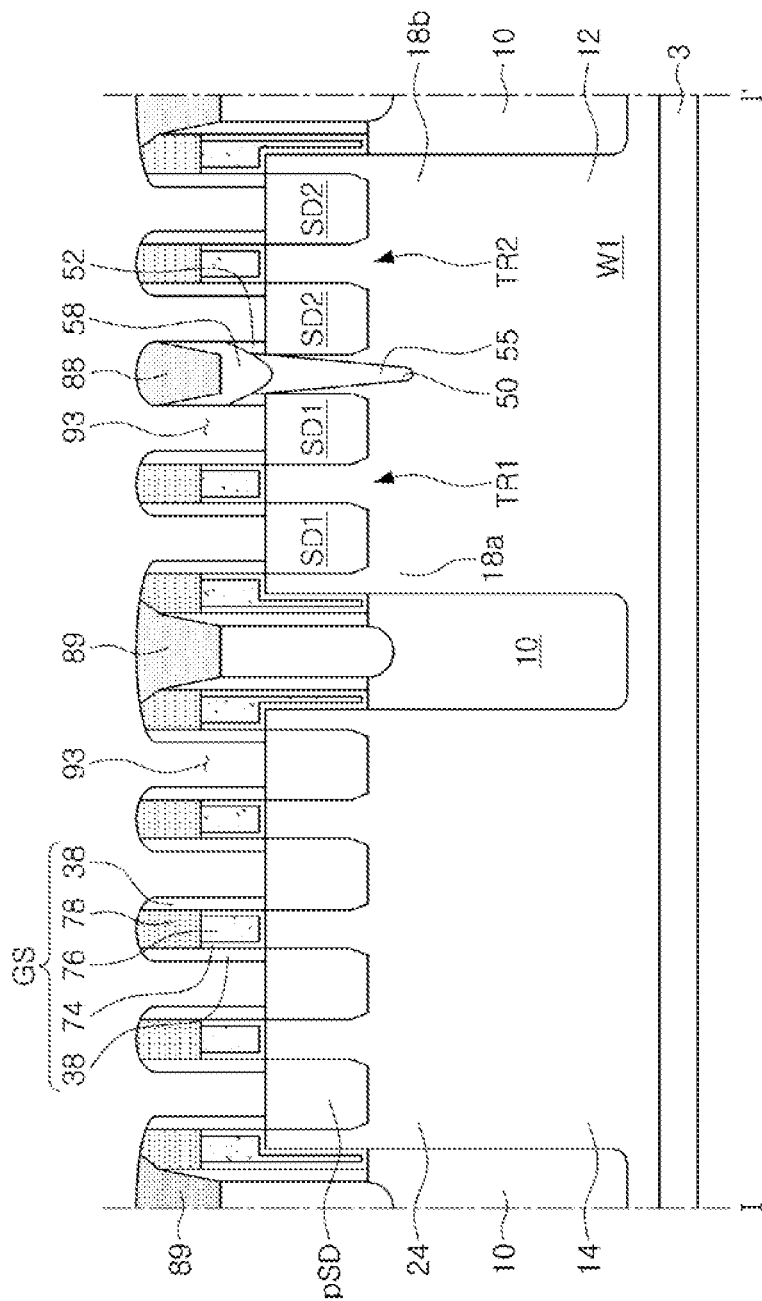
Figure 26B:
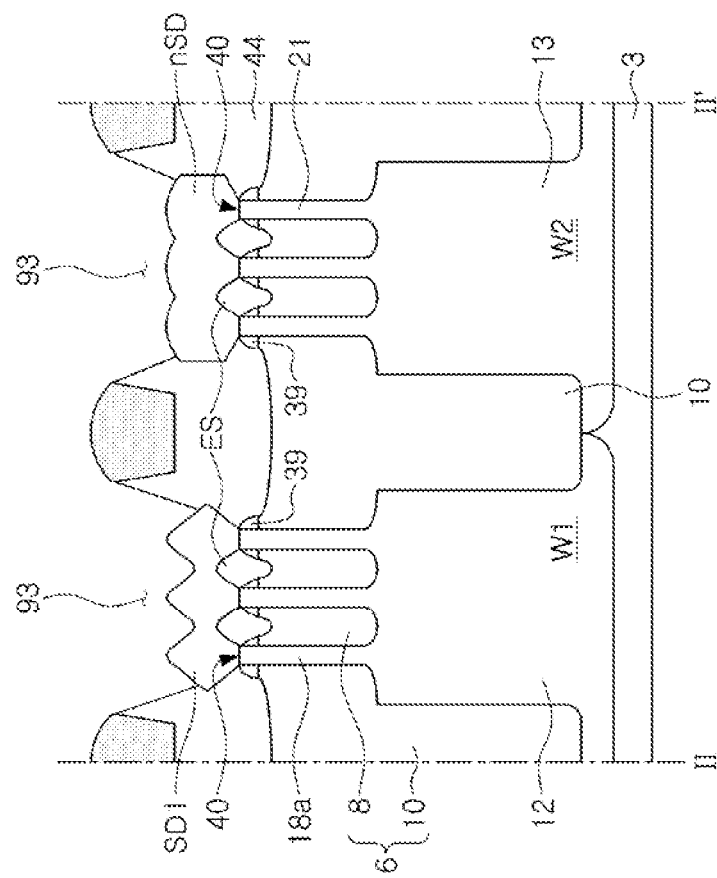

With reference to FIGS. 26A and 26B, contact openings 93 may be formed in such a manner that the interlayer insulating patterns 44 are etched using the gate structures GS and the upper insulating patterns 88 and 89 as an etching mask. The contact openings 93 may allow the source/drain regions nSD, pSD, SD1, and SD2 to be exposed.

In an example embodiment of the present inventive concept, the contact openings 93 may have inclined side walls, such that widths thereof are gradually reduced in a direction from an upper portion toward a lower portion.

With reference to FIGS. 1, 2A-2C, 3A-3D and 4, again, the contact openings 93 may include contact structures CS formed therein. Forming the contact structures CS may include forming conductive material layers on the semiconductor substrate including the contact openings 93, and may include polishing the conductive material layers until the gate structures GS and the upper insulating patterns 88 and 89 are exposed. The conductive material layers maybe polished by the chemical mechanical polishing process. Each of the contact structures CS may include a metal silicide layer 95, a barrier layer 96, and a contact plug 97.

The barrier layer 96 may cover a side surface and a bottom surface of the contact plug 97. The metal silicide layer 95 may be disposed between the barrier layer 96 and the source/drain regions nSD and pSD. The metal silicide layer 95 may be in direct contact with the source/drain regions nSD and pSD.

In an example embodiment of the present inventive concept, the contact openings 93 and the contact structures CS may be formed with a self-aligned process. In other words, an etching process of forming the contact openings 93 may be performed in such a manner that a photoresist pattern of a photo process is not used, but the gate structures GS and the upper insulating patterns 88 and 89 are used as an etching mask. Therefore, the contact openings 93 and the contact structures CS may be self-aligned in a region defined by the gate structures GS and the upper insulating patterns 88 and 89. Therefore, the contact structures CS may be formed with the self-aligned process, so that the contact structures CS maybe formed in a relatively small space while electrical shorts do not occur between the contact structures CS and conductive patterns disposed adjacent thereto. Therefore, since a number of defects, such as electrical shorts occurring while the contact structures are formed in a relatively narrow space, and the like, may be reduced, higher degree of integration in the semiconductor device and better reliability thereof may be obtained simultaneously.

Figure 27:
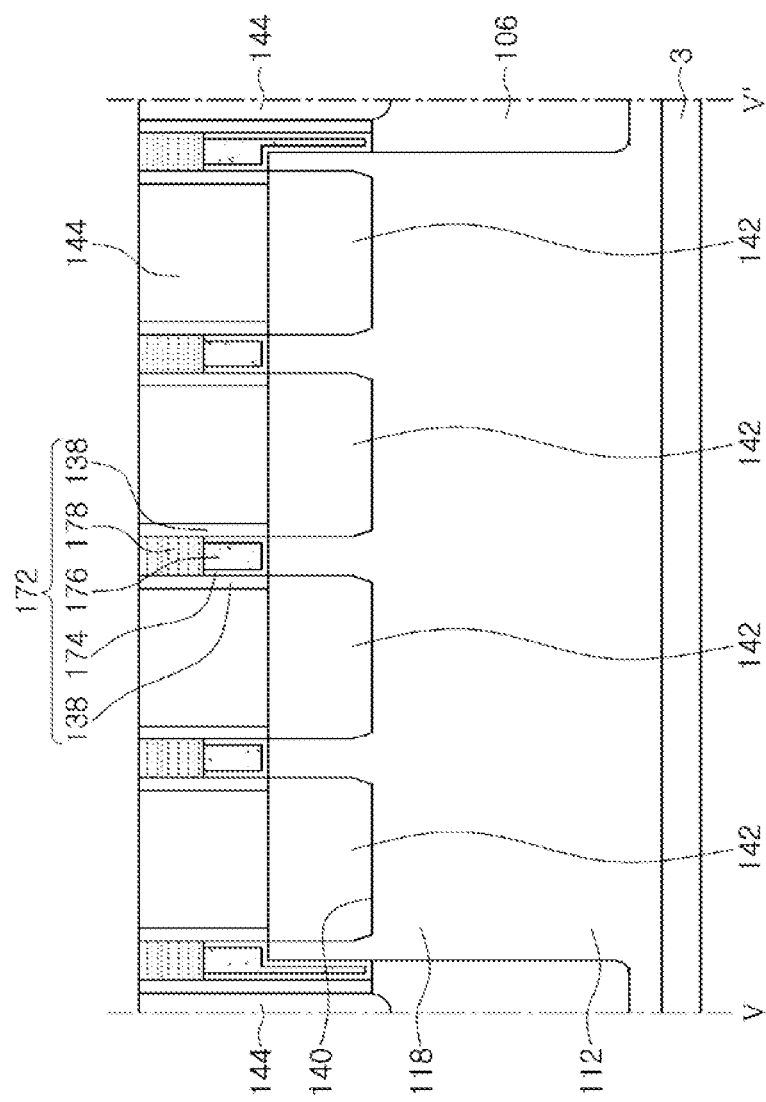
FIGS. 27 to 29 are views illustrating a method of forming a modified example of a semiconductor device according to an example embodiment of the present inventive concept.
Figure 28:
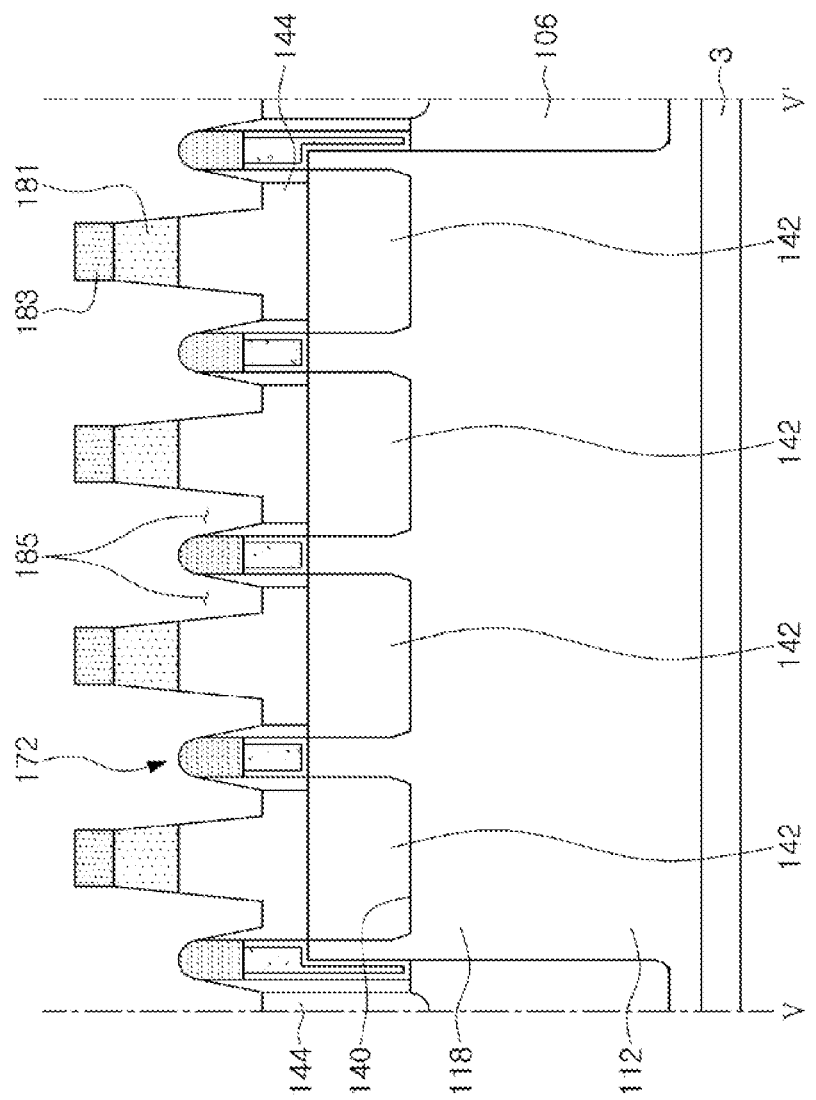
Figure 29:
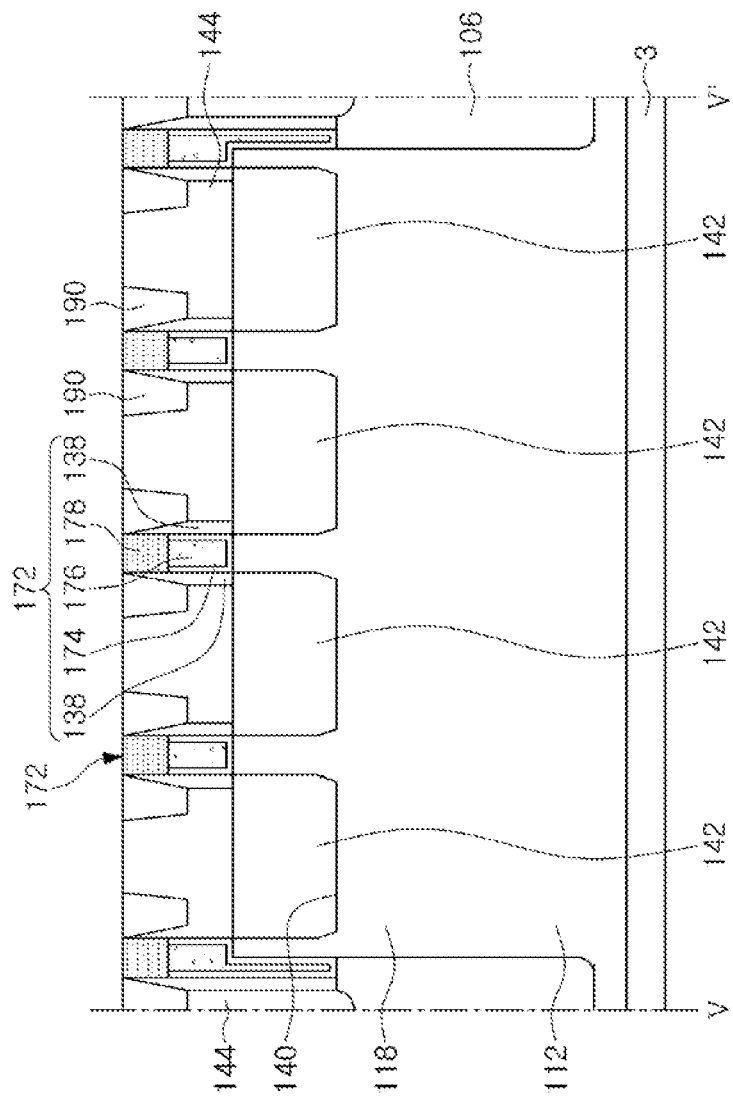

A method of forming a different modified example of a semiconductor device, according to an example embodiment of the present inventive concept, described with reference to FIGS. 7A, 7B, and 8, will be described with reference to FIGS. 27 to 29. FIGS. 27 to 29 are cross-sectional views taken along line V-V' of FIGS. 7A and 7B.

With reference to FIGS. 7A and 27, a different isolation region 106 defining a different active region on a semiconductor substrate 3 may be formed. The different active region may include a different lower active region 112 and other fin active lines 118 on the different lower active region 112. The different isolation region 106, the different lower active region 112, and the other fin active lines 118 may correspond to the isolation region 6, the first lower active region 12, and the fin active lines 18, described in FIG. 10 and FIGS. 11A to 11C, respectively.

Gate structures 172 and interlayer insulating patterns 144 disposed between the gate structures 172 may be formed on the fin active lines 118 and the isolation region 106. Each of the gate structures 172 may include gate spacers 138, a gate electrode 176 and a gate capping pattern 178 disposed between the gate spacers 138 and stacked in sequence, and a gate dielectric material 174 covering a bottom surface of the gate electrode 176 and extending between the gate electrode 176 and the gate spacers 138.

Figure 21A:
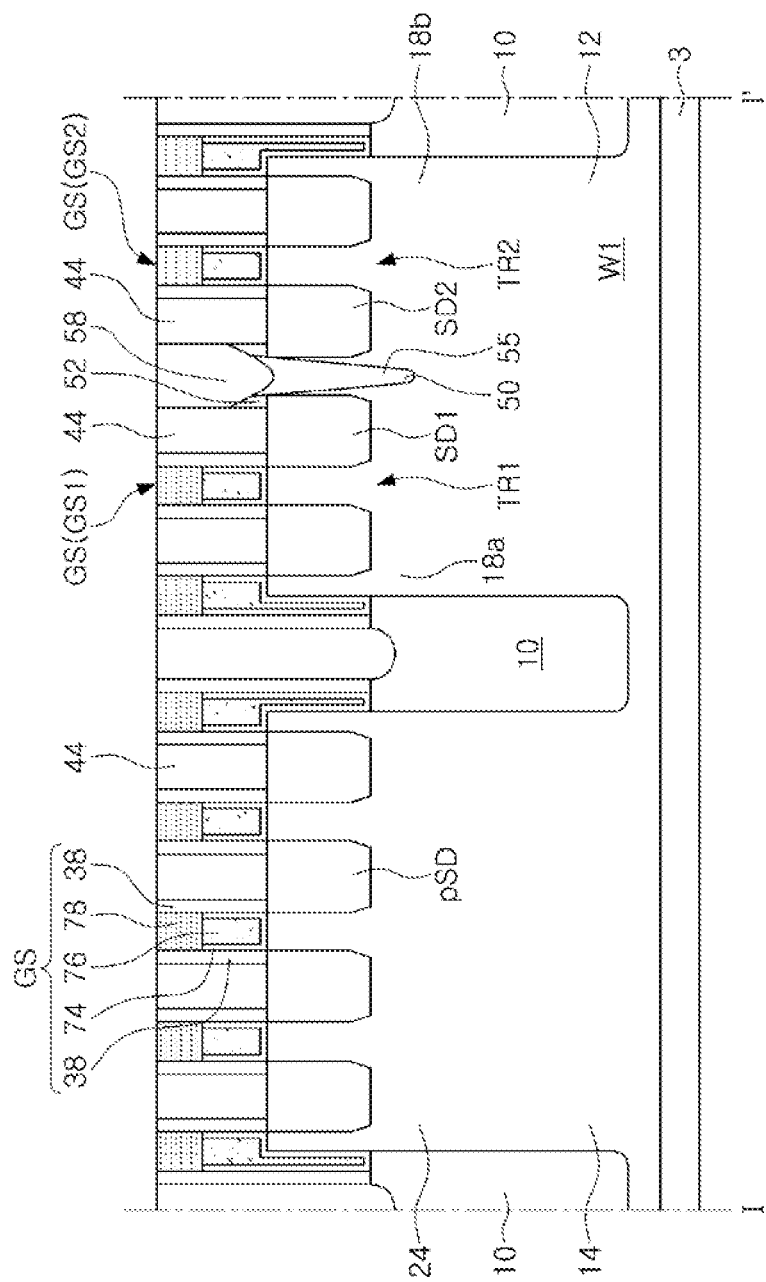
Figure 21B:
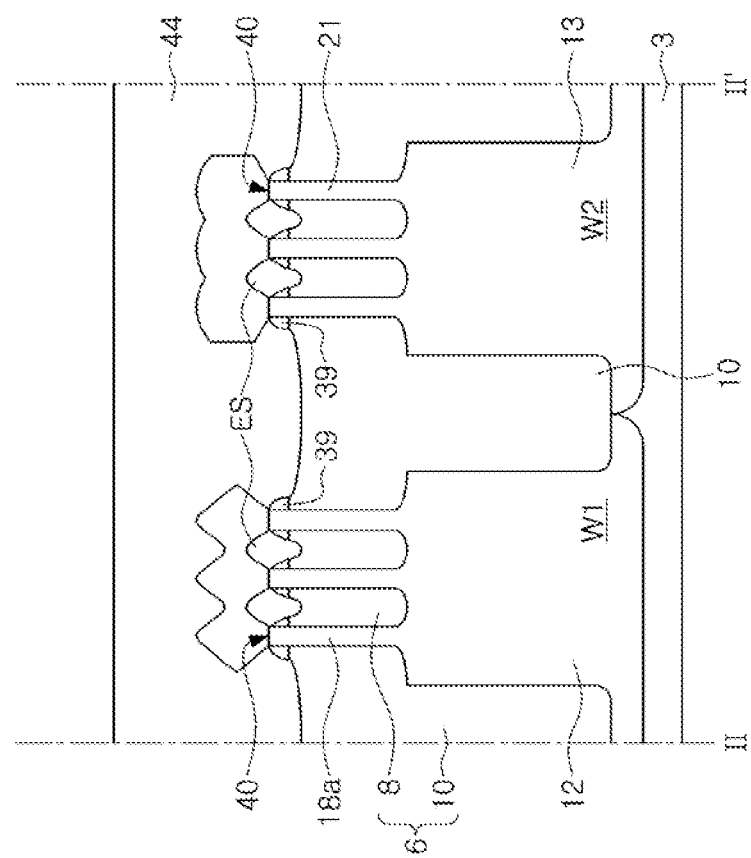
Figure 21C:
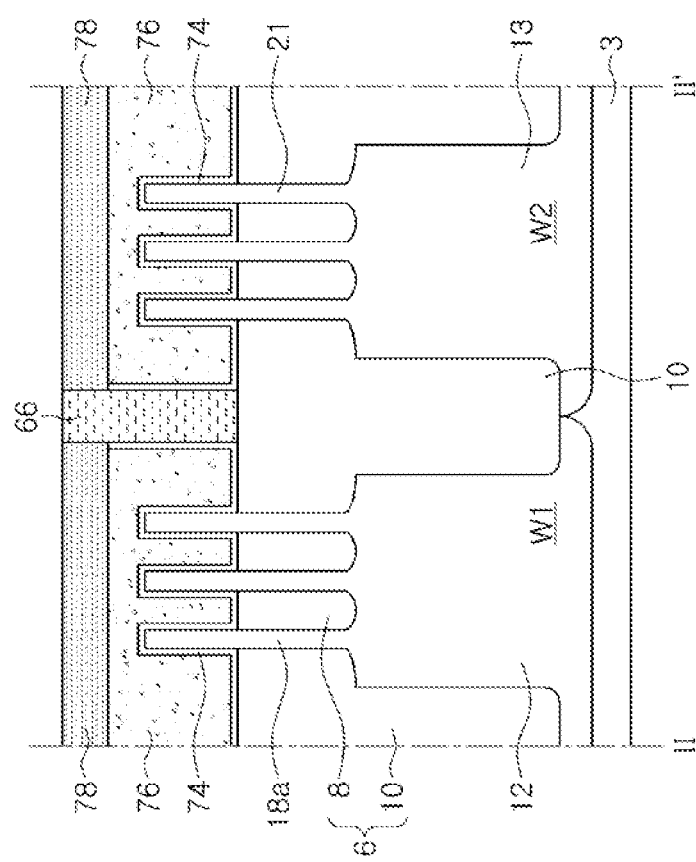
Figure 22:
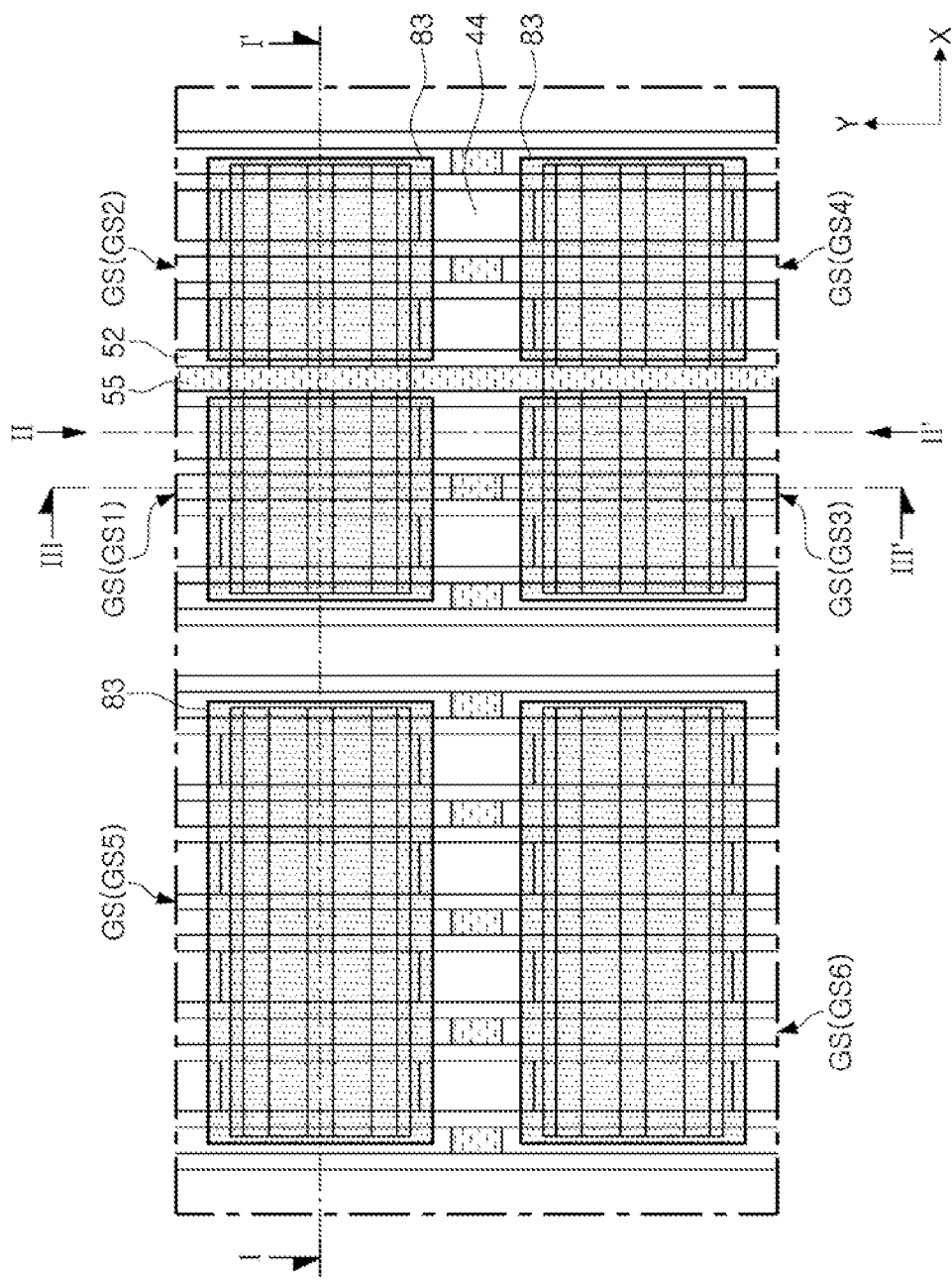
Figure 23A:
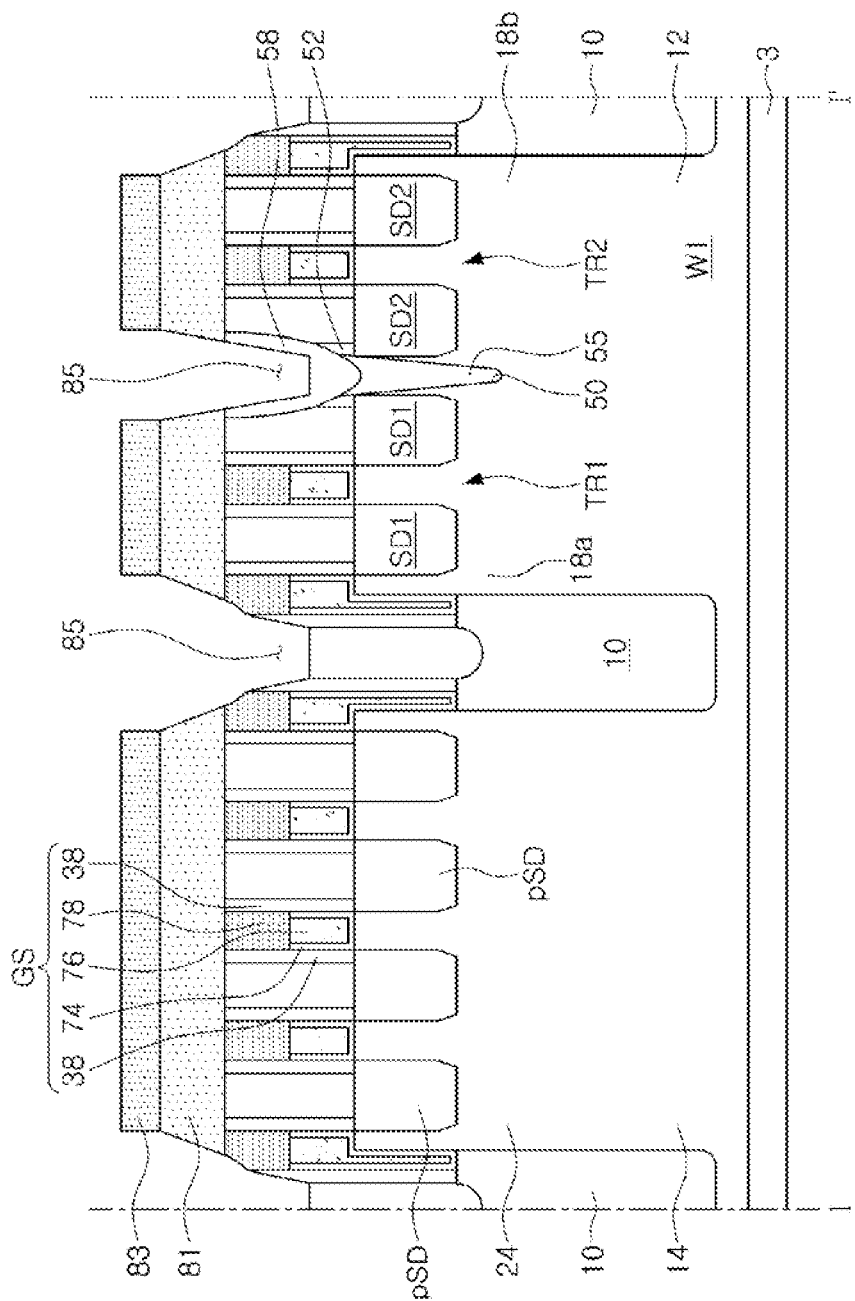
Figure 23B:
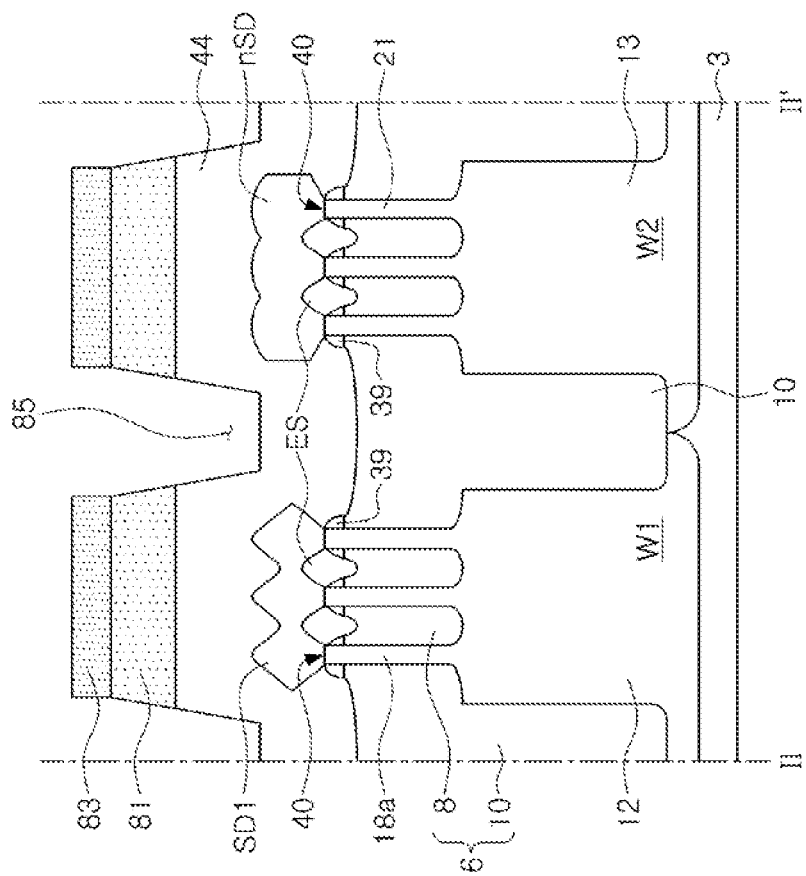
Figure 23C:
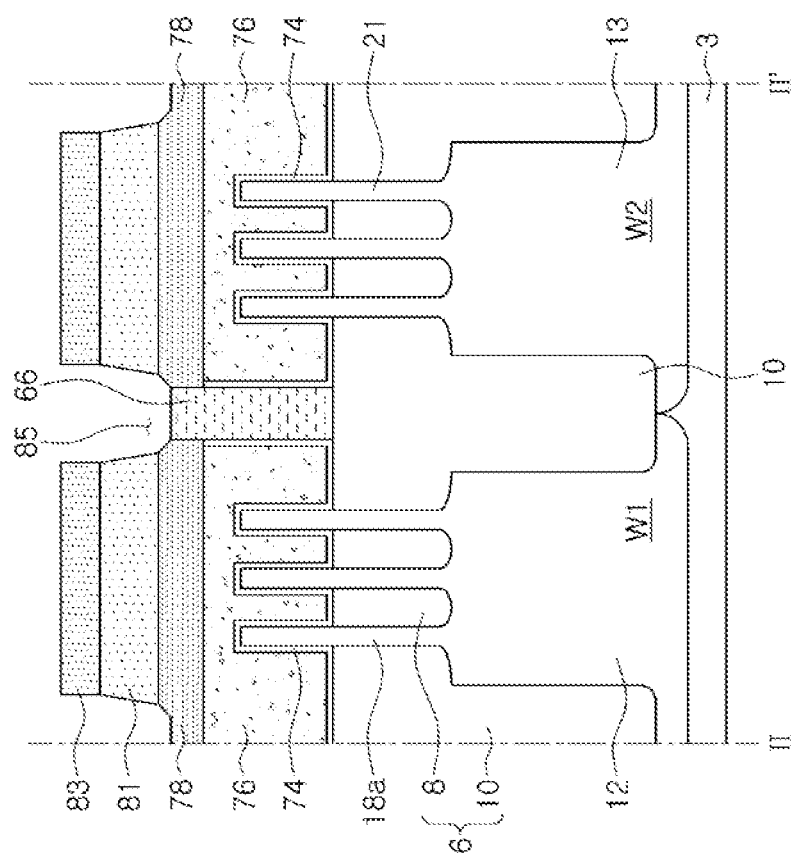
Figure 24:
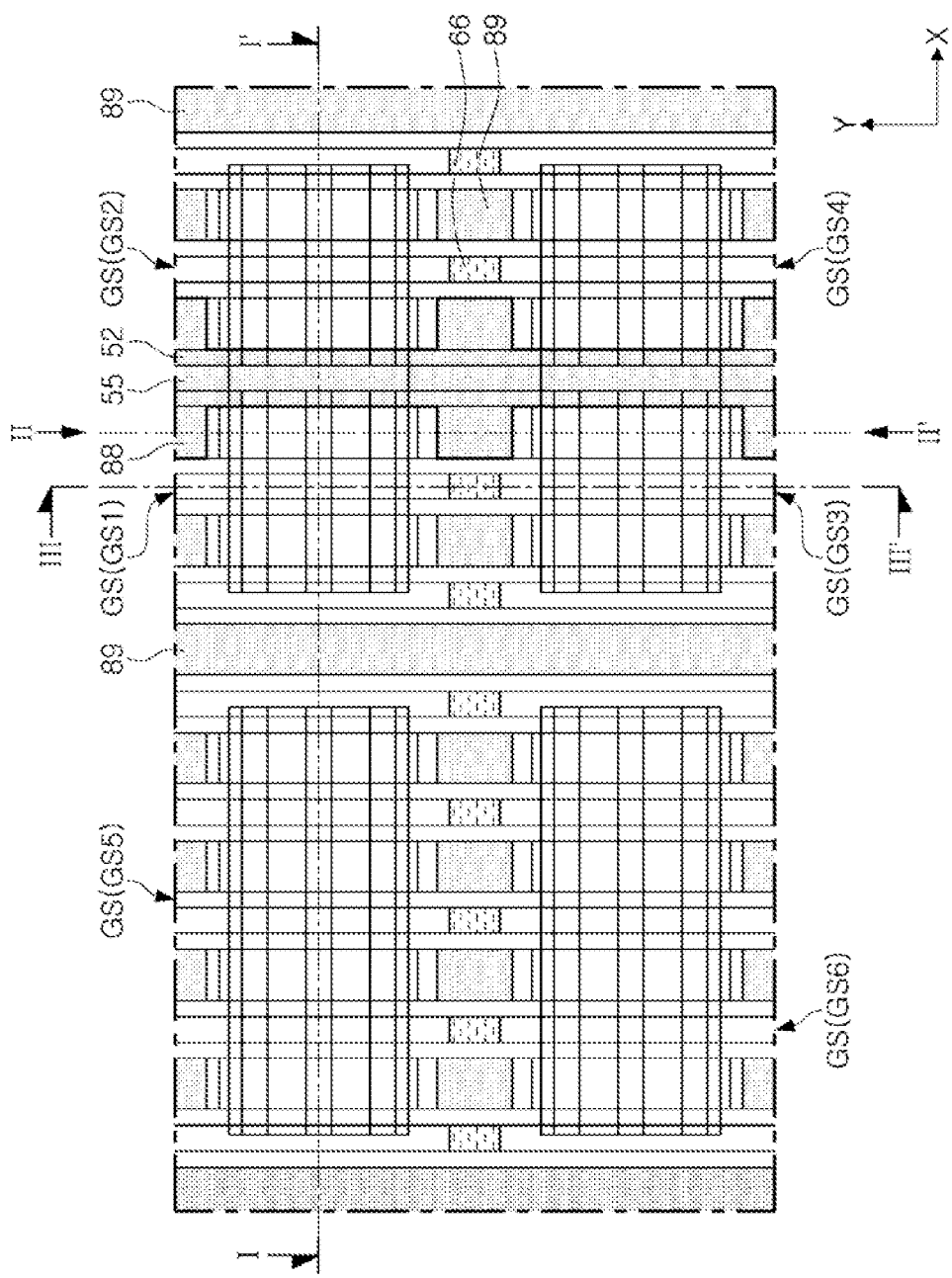
Figure 25A:
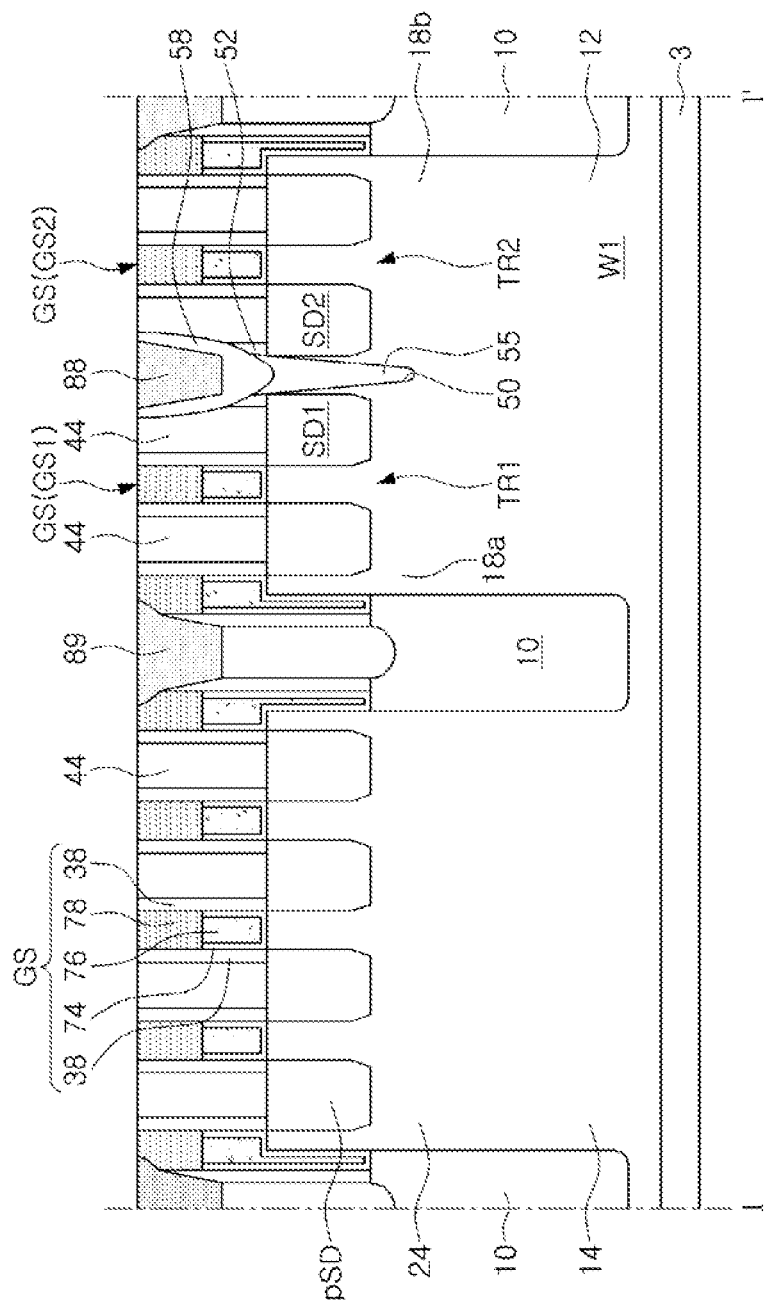
Figure 25B:
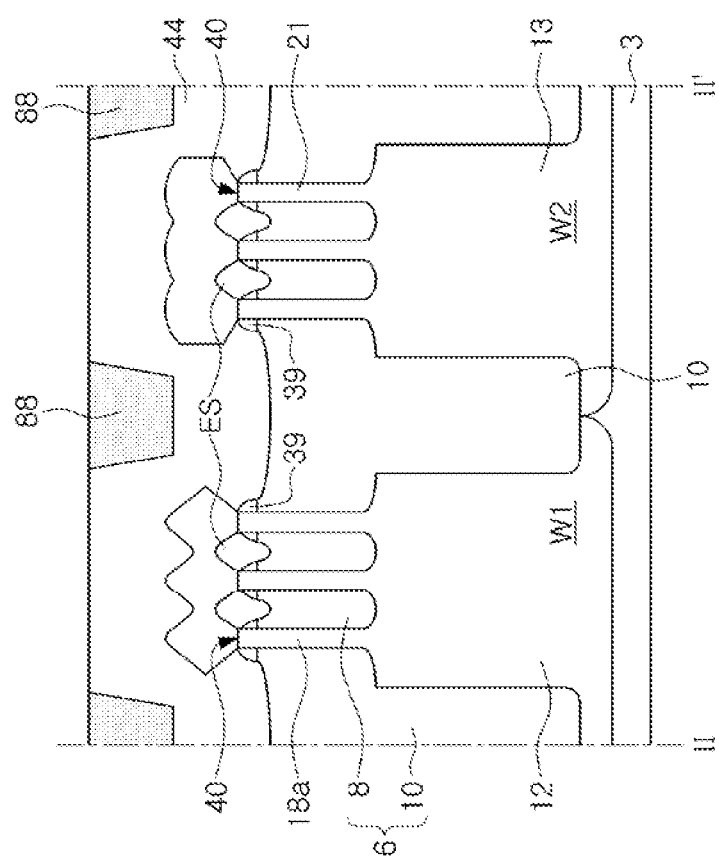
Figure 25C:
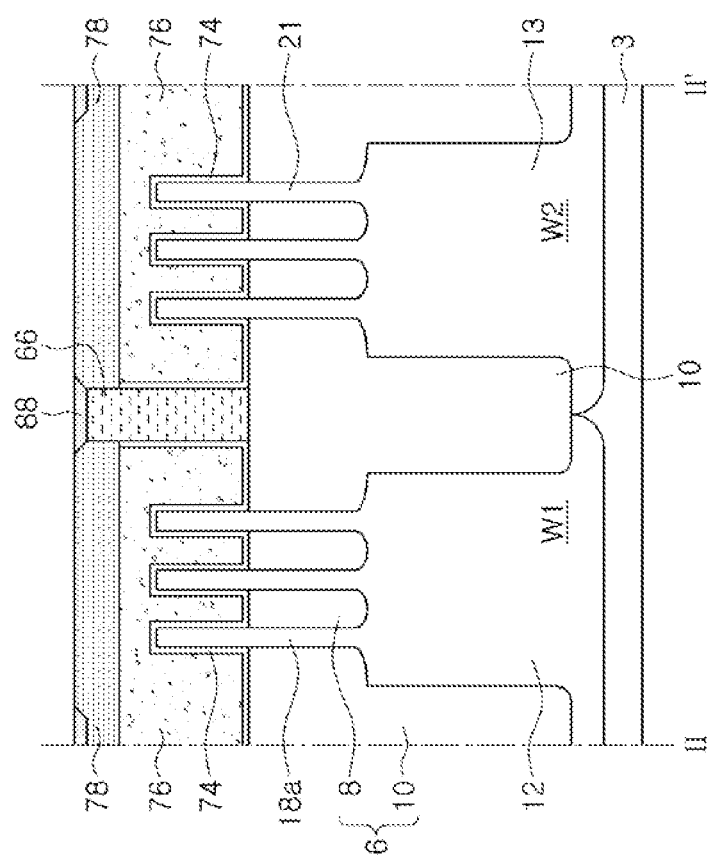

The gate structures 172 and the interlayer insulating patterns 144 may correspond to the gate structures GS and the interlayer insulating patterns 44, described in FIG. 21A. Therefore, the gate structures 172 and the interlayer insulating patterns 144 may be formed using a process substantially the same as that used in forming the gate structures GS and the interlayer insulating patterns 44, described in FIG. 21A.

With reference to FIGS. 7A and 28, an upper layer 181 and a third mask pattern 183 may be formed. The upper layer 181 and the third mask pattern 183 may be formed using a process the same as that used in forming the upper layer 81 and the third mask patterns 83, described with reference to FIGS. 22, 23A, 23B, and 23C. The third mask patterns 183 may overlap the other source/drain regions 142, and may be narrower than the other source/drain regions 142.

The upper layer 181 and the interlayer insulating patterns 144 may be etched using the third mask pattern 183, thus forming upper recesses 185. The upper recesses 185 may be formed on opposing sides of the gate structures 172. The upper recesses 185 may be formed using a process the same as that used in forming the upper recesses 85, described in FIGS. 22, 23A, 23B, and 23C.

With reference to FIGS. 7B and 29, upper capping patterns 190 remaining in the upper recesses (see 185 in FIG. 28) may be formed in such a manner that an upper insulating layer is formed on the semiconductor substrate including the upper recesses (see 185 in FIG. 28), and the upper insulating layer is polished. The upper capping patterns 190 may be formed of a material the same as that of the upper insulating patterns 88 and 89, described in FIGS. 24, 25A, 25B, and 25C.

With reference to FIGS. 7B and 8, again, contact openings allowing the other source/drain regions 142 to be exposed may be formed in such a manner that the interlayer insulating patterns 144 are etched using the upper capping patterns 190 and the gate structures 172 as an etching mask. In addition, other contact structures 194 filling the contact openings maybe formed. As such, the other contact structures 194 maybe formed with the self-aligned process. Each of the other contact structures 194 may include a contact plug 197, a barrier layer 196 covering a bottom surface and a side surface of the contact plug 197, and a metal silicide layer 195 below the barrier layer 196 and in contact with the other source/drain regions 142. The other contact structures 194 may be formed of a material the same as that of the contact structures CS described in FIGS. 1, 2A-2C, 3A-3D and 4.

As described above, the contact structures CS or 194 may be formed with the self-aligned process, thus forming the contact structures CS or 194 in a relatively narrow space while electrical shorts do not occur between the contact structures CS or 194 and conductive patterns disposed adjacent thereto. Therefore, since the number of defects, such as electrical shorts occurring while the contact structures CS or 194 are formed in a relatively narrow space, and the like, may be reduced, higher degree of integration in the semiconductor device and better reliability thereof may be obtained, simultaneously.

According to an example embodiment of the present inventive concept, a semiconductor device including contact structures formed with a self-aligned contact process may be provided. The contact structures may be formed with the self-aligned process, thus forming the contact structures in a relatively narrow space while electrical shorts do not occur between the contact structures and conductive patterns disposed adjacent thereto. Therefore, higher degree of integration in the semiconductor device and better reliability thereof may be obtained, simultaneously.

While specific example embodiments of the present inventive concept have been shown and described above, it will be apparent to those skilled in the art that modifications and variations could be made without departing from the scope of the present inventive concept as defined by the appended claims.

What is claimed is:
1. A semiconductor device, comprising:
    an active region on a substrate and having a first recess and a second recess;
    an isolation region on the substrate and on a sidewall of the active region;

a first gate structure on a first active portion of the active region;

a second gate structure on a second active portion of the active region and spaced apart from the first gate structure;

a source/drain region in a recess of the active region between the first active portion and the second active portion;

a first interlayer insulating pattern on a first source/drain portion of the source/drain region;

a second interlayer insulating pattern on a second source/drain portion of the source/drain region;

a first upper capping pattern on the first interlayer insulating pattern;

a second upper capping pattern on the second interlayer insulating pattern; and a contact structure on a third source/drain portion of the source/drain region, wherein the third source/drain portion is between the first source/drain portion and the second source/drain portion, wherein the first gate structure includes a first gate dielectric, a first gate electrode on the first gate dielectric and a first gate capping pattern on the first gate electrode, wherein the second gate structure includes a second gate dielectric, a second gate electrode on the second gate dielectric and a second gate capping pattern on the second gate electrode, wherein the first and second interlayer insulating patterns and the first and second upper capping patterns are between the first gate structure and the second gate structure, and wherein the contact structure is between the first interlayer insulating pattern and the second interlayer insulating pattern and between the first upper capping pattern and the second upper capping pattern.

2. The semiconductor device of claim 1, wherein upper surfaces of the first upper capping pattern, the second upper capping pattern, the first gate capping pattern, the second gate capping pattern and the contact structure are coplanar with each other.

3. The semiconductor device of claim 1, wherein an upper surface of the contact structure is coplanar with upper surfaces of the first and second upper capping patterns.

4. The semiconductor device of claim 1, wherein the first and second interlayer insulating patterns include a first insulating material, wherein the first and second gate capping patterns include a second insulating material, and wherein the second insulating material is different from the first insulating material.

5. The semiconductor device of claim 4, wherein the first and second upper capping patterns include a third insulating material, and wherein the third insulating material is different from the first insulating material.

6. The semiconductor device of claim 1, wherein the contact structure includes a contact plug and a barrier layer covering a bottom surface and a sidewall of the contact plug.

7. The semiconductor device of claim 6, wherein the contact structure further includes a metal silicide layer between the barrier layer and the source/drain region.

8. The semiconductor device of claim 1, wherein each of the first and second gate structures further includes a gate portion on the isolation region and covering a portion of the sidewall of the active region.

9. The semiconductor device of claim 1, wherein the first gate dielectric covers a bottom surface and a sidewall of the first gate electrode, and wherein the second gate dielectric covers a bottom surface and a sidewall of the second gate electrode.

10. The semiconductor device of claim 9, further comprising:

a first gate spacer between the first interlayer insulating pattern and the first gate dielectric; and a second gate spacer between the second interlayer insulating pattern and the second gate dielectric.

11. The semiconductor device of claim 10, wherein a width of the first interlayer insulating pattern is greater than a width of the first gate spacer.

12. The semiconductor device of claim 9, wherein each of the first and second gate electrodes has a first width, and wherein a distance between the first gate electrode and the second gate electrode is more than three times of the first width.

13. The semiconductor device of claim 9, wherein each of the first and second gate electrodes has a first width, and wherein a distance between the first gate electrode and the second gate electrode is more than four times of the first width.

14. A method of forming a semiconductor device, comprising:

providing a semiconductor substrate;

forming an isolation region defining an active region and being on the semiconductor substrate;

forming sacrificial gate structures on the active region and the isolation region, wherein each of the sacrificial gate structures includes a sacrificial gate pattern and a gate spacer on a sidewall of the sacrificial gate pattern;

forming an interlayer insulating pattern between the sacrificial gate structures;

forming gate structures by replacing the sacrificial gate patterns of the sacrificial gate structures, forming upper recesses in the interlayer insulating pattern and exposing the gate structures;

forming upper capping patterns in the upper recesses; and forming a contact structure penetrating through the interlayer insulating pattern, wherein the gate structures include a first gate structure and a second gate structure on the active region and spaced apart from each other, wherein the upper capping patterns include a first upper capping pattern and a second capping pattern spaced apart from each other, wherein the contact structure includes a portion between the first upper capping pattern and the second capping pattern, and wherein the contact structure, the first upper capping pattern and the second capping pattern are between the first gate structure and the second gate structure.

15. The method of claim 14, wherein the first gate structure includes a first gate dielectric, a first gate electrode on the first gate dielectric and a first gate capping pattern on the first gate electrode, and wherein the second gate structure includes a second gate dielectric, a second gate electrode on the second gate dielectric and a second gate capping pattern on the second gate electrode.

16. The method of claim 14, wherein an upper surface of the contact structure is coplanar with upper surfaces of the first and second upper capping patterns.

17. The method of claim 14, further comprising:
before the forming of the interlayer insulating pattern, forming a recess in the active region; and
forming a source/drain region in the recess,
wherein the contact structure contacts the source/drain region.

\* \* \* \* \*